(12) United States Patent
Moghadam et al.

(10) Patent No.: US 6,936,551 B2
(45) Date of Patent: Aug. 30, 2005

(54) METHODS AND APPARATUS FOR E-BEAM TREATMENT USED TO FABRICATE INTEGRATED CIRCUIT DEVICES

(75) Inventors: Farhad Moghadam, Saratoga, CA (US); Jun Zhao, Cupertino, CA (US); Timothy Weidman, Sunnyvale, CA (US); Rick J. Roberts, Sunnyvale, CA (US); Li-Qun Xia, Santa Clara, CA (US); Alexandros T. Demos, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/428,374

(22) Filed: May 1, 2003

(65) Prior Publication Data

US 2003/0232495 A1 Dec. 18, 2003

Related U.S. Application Data

(60) Provisional application No. 60/378,799, filed on May 8, 2002.

(51) Int. Cl.[7] .................... H01L 21/31; H01L 21/469
(52) U.S. Cl. .................... 438/780; 438/788; 438/790
(58) Field of Search .................... 438/780, 788, 438/789, 790, 792, 793, 794, 623, 624, 781

(56) References Cited

U.S. PATENT DOCUMENTS

| | | | |
|---|---|---|---|
| 4,845,054 A | 7/1989 | Mitchener | |
| 5,000,113 A | 3/1991 | Wang et al. | |
| 5,003,178 A | 3/1991 | Livesay | |
| 5,468,595 A | 11/1995 | Livesay | 430/296 |
| 5,554,570 A | 9/1996 | Maeda et al. | |
| 5,776,990 A | 7/1998 | Hedrick et al. | |
| 5,989,998 A | 11/1999 | Sugahara et al. | |
| 6,045,877 A | * 4/2000 | Gleason et al. | 427/522 |
| 6,051,321 A | 4/2000 | Lee et al. | |
| 6,054,379 A | 4/2000 | Yau et al. | |
| 6,057,251 A | 5/2000 | Goo et al. | |
| 6,068,884 A | 5/2000 | Rose et al. | |
| 6,080,526 A | 6/2000 | Yang et al. | |
| 6,132,814 A | 10/2000 | Livesay et al. | 427/542 |
| 6,159,871 A | 12/2000 | Loboda et al. | |
| 6,169,039 B1 | * 1/2001 | Lin et al. | 438/761 |
| 6,195,246 B1 | 2/2001 | Livesay et al. | 361/234 |
| 6,204,201 B1 | 3/2001 | Ross | 438/778 |
| 6,207,555 B1 | 3/2001 | Ross | 438/633 |
| 6,235,453 B1 | * 5/2001 | You et al. | 430/329 |
| 6,271,146 B1 | 8/2001 | Ross | |
| 6,303,047 B1 | 10/2001 | Aronowitz et al. | |
| 6,312,793 B1 | 11/2001 | Grill et al. | |
| 6,316,063 B1 | 11/2001 | Andideh et al. | |
| 6,316,167 B1 | * 11/2001 | Angelopoulos et al. | 430/313 |
| 6,340,628 B1 | 1/2002 | Van Cleemput et al. | |

(Continued)

FOREIGN PATENT DOCUMENTS

| EP | 0 935 283 A2 | 8/1999 |
|---|---|---|
| EP | 1 354 980 A1 | 10/2003 |

(Continued)

OTHER PUBLICATIONS

PCT Written Opinion; PCT/US03/14272, May 8, 2003.
U.S. Appl. No. 10/342,077, filed Jan. 13, 2003. (AMAT/7279).
PCT International Search Report for PCT/US 03/14272, dated Jan. 21, 2004 (AMAT/7034.PC).

Primary Examiner—W. David Coleman
Assistant Examiner—Khiem D. Nguyen
(74) Attorney, Agent, or Firm—Moser, Patterson & Sheridan

(57) ABSTRACT

One embodiment of the present invention is a method for fabricating a low-k dielectric film that includes steps of: (a) chemical vapor depositing a lower-k dielectric film; and (b) e-beam treating the lower-k dielectric film.

36 Claims, 8 Drawing Sheets

U.S. PATENT DOCUMENTS

| | | |
|---|---|---|
| 6,352,945 B1 | 3/2002 | Matsuki et al. |
| 6,383,955 B1 | 5/2002 | Matsuki et al. |
| 6,410,463 B1 | 6/2002 | Matsuki |
| 6,432,846 B1 | 8/2002 | Matsuki |
| 6,437,443 B1 | 8/2002 | Grill et al. |
| 6,441,491 B1 | 8/2002 | Grill et al. |
| 6,444,136 B1 | 9/2002 | Liu et al. |
| 6,455,445 B2 | 9/2002 | Matsuki |
| 6,479,110 B2 | 11/2002 | Grill et al. |
| 6,486,082 B1 | 11/2002 | Cho et al. |
| 6,500,773 B1 | 12/2002 | Gaillard et al. |
| 6,509,259 B1 | 1/2003 | Wang et al. |
| 6,514,880 B2 | 2/2003 | Matsuki et al. |
| 6,524,974 B1 | 2/2003 | Sukharev |
| 6,541,367 B1 | 4/2003 | Mandal |
| 6,548,899 B2 | 4/2003 | Ross |
| 6,582,777 B1 | 6/2003 | Ross et al. |
| 6,583,048 B1 | 6/2003 | Vincent et al. |
| 6,583,071 B1 | 6/2003 | Weidman et al. |
| 6,593,655 B1 | 7/2003 | Loboda et al. |
| 6,596,627 B2 | 7/2003 | Mandal |
| 6,605,549 B2 | 8/2003 | Leu et al. |
| 6,652,922 B1 | 11/2003 | Forester et al. |
| 6,677,253 B2 | 1/2004 | Andideh et al. |
| 6,734,533 B2 | 5/2004 | Wong |
| 6,737,365 B1 | 5/2004 | Kloster et al. |
| 2001/0018129 A1 | 8/2001 | Shiota et al. ............... 428/447 |
| 2002/0037442 A1 | 3/2002 | Grill et al. |
| 2002/0098714 A1 | 7/2002 | Grill et al. |
| 2002/0142579 A1 | 10/2002 | Vincent et al. |
| 2002/0142585 A1 | 10/2002 | Mandal |
| 2002/0160626 A1 | 10/2002 | Matsuki et al. |
| 2002/0180051 A1 | 12/2002 | Grill et al. |
| 2002/0197849 A1 | 12/2002 | Mandal |
| 2003/0008998 A1 | 1/2003 | Aoi |
| 2003/0017718 A1 | 1/2003 | Aoi |
| 2003/0040195 A1 | 2/2003 | Chang et al. |
| 2003/0064607 A1 * | 4/2003 | Leu et al. .................. 438/780 |
| 2003/0104689 A1 | 6/2003 | Shioya et al. |
| 2003/0104708 A1 | 6/2003 | Cho et al. |
| 2003/0109136 A1 | 6/2003 | Shioya et al. |
| 2003/0111712 A1 | 6/2003 | Andideh |
| 2003/0116421 A1 | 6/2003 | Xu et al. |
| 2003/0176030 A1 | 9/2003 | Tsuji et al. |
| 2003/0198742 A1 | 10/2003 | Vrtis et al. |
| 2003/0211244 A1 | 11/2003 | Li et al. |
| 2003/0211728 A1 | 11/2003 | Mandal |
| 2003/0224593 A1 | 12/2003 | Wong |
| 2004/0038514 A1 | 2/2004 | Hyodo et al. |
| 2004/0039219 A1 | 2/2004 | Chen et al. |
| 2004/0078764 A1 | 4/2004 | Forester et al. |
| 2004/0096593 A1 | 5/2004 | Lukas et al. |
| 2004/0096672 A1 | 5/2004 | Lukas et al. |
| 2004/0101632 A1 | 5/2004 | Zhu et al. |
| 2004/0101633 A1 | 5/2004 | Zheng et al. |
| 2004/0175957 A1 | 9/2004 | Lukas et al. |

FOREIGN PATENT DOCUMENTS

| | | | |
|---|---|---|---|
| WO | WO 97/00535 A1 | 1/1997 | |
| WO | WO 99/21706 A1 | 5/1999 | |
| WO | WO 01/29052 A1 | 4/2001 | |
| WO | WO 01/48805 A1 | 7/2001 | |
| WO | 0148805 | 7/2001 | ......... H01L/21/312 |
| WO | WO 01/61737 A1 | 8/2001 | |
| WO | 0161737 | 8/2001 | ....... H01L/21/3105 |

* cited by examiner

METHODS AND APPARATUS FOR E-BEAM TREATMENT USED TO FABRICATE INTEGRATED CIRCUIT DEVICES

This application claims the benefit of U.S. Provisional Application No. 60/378,799, filed on May 8, 2002 which application is incorporated herein by reference.

TECHNICAL FIELD OF THE INVENTION

One or more embodiments of the present invention pertain to apparatus for electron beam treatments used to fabricate integrated circuit devices.

BACKGROUND OF THE INVENTION

Fabrication of integrated devices, for example, and without limitation, semiconductor integrated devices, is complicated and, due to increasingly stringent requirements on device designs due to demands for greater device speed, fabrication is becoming ever more complicated. For example, integrated circuit geometries have decreased in size substantially since such devices were first introduced several decades ago. Since then, integrated circuits have generally followed a two year/half-size rule (often called Moore's Law), which means that the number of devices on a chip doubles every two years. Today's fabrication facilities are routinely producing devices having 0.13 $\mu$m feature sizes, and tomorrow's facilities soon will be producing devices having even smaller feature sizes. In addition, integrated circuits are being layered or stacked with ever decreasing insulating thickness between each circuitry layer.

In the production of advanced integrated circuits that have minimum feature sizes of 0.13 $\mu$m and below, problems of RC delay, power consumption, and crosstalk become significant. For example, device speed is limited in part by the RC delay which is determined by the resistance of the metal used in the interconnect scheme, and the dielectric constant of the insulating dielectric material used between the metal interconnects. In addition, with decreasing geometries and device sizes, the semiconductor industry has sought to avoid parasitic capacitance and crosstalk noise caused by inadequate insulating layers in the integrated circuits. One way to achieve the desired low RC delay and higher performance in integrated circuit devices involves the use of dielectric materials in the insulating layers that have a low dielectric constant (k).

As the required value for the dielectric constant of materials is decreased due to device performance demands, there are many different types of low-k materials that are being investigated to determine whether they can perform acceptably. Most of these candidates are porous materials that can be organic materials, inorganic materials, organic compositions that might include inorganic components, and so forth.

Formation of low-k materials for use in interconnect applications has been attempted mainly by chemical vapor deposition ("CVD") or spin-on techniques. Most such low-k materials deposited using these techniques require thermal curing after deposition to achieve desired film properties. This is problematic because there is a trend (due to the types of metals used to fabricate the integrated circuits, and to reduce thermal stress) to reduce the total thermal budget of the interconnect process flow—this includes reducing peak process temperatures as well as total process time at high process temperatures.

Process steps to reduce the dielectric constant of a material must also improve its electrical properties (such as, for example, and without limitation, by reducing failures due to early dielectric breakdowns, by enhancing its performance as an insulator, and by reducing the presence of unwanted charges within its material lattice), while maintaining or improving its physical properties. One disadvantage of using a thermal process to achieve desired film properties is that it adds an additional process step, which includes possibly an additional process tool.

The need for even further processing steps depends on several variables. For example, for porous materials there is a need to insure that mechanical and physical properties are acceptable (for example, and without limitation, stress, planarizability, and so forth).

In addition, the use of spin-on-glass materials is limited in terms of thickness by their tendency to crack when made in thick layers and cured. Spin-on-glass liquids consist of a silicon oxygen network of polymers, (typically, one of which is siloxane), dissolved in an organic solvent (typically a combination of a high boiling point solvent and a low boiling point solvent). The dissolved spin-on-glass material is coated onto a spinning semiconductor wafer or substrate. After spinning onto the wafer or substrate, low boiling point solvents are expelled using a low temperature hot plate bake process. The wafer or substrate is then heated in vacuum or nitrogen to a temperature typically in a range from about 300° C. to about 400° C. This removes higher boiling point solvents and/or organic components to create porosity in the film.

In addition to the above, a typical prior art dual damascene fabrication process begins with deposition of an oxide layer over a substrate. Next, a relatively thin silicon nitride etch stop layer is deposited over the oxide layer for use in a subsequent etching step. Next, a layer of intermetal dielectric is deposited on the etch stop layer (typically, the intermetal dielectric material is silicon oxide so that the underlying silicon nitride layer acts an effective etch stop when openings for second level interconnects are provided in the intermetal oxide layer)—the thickness of the intermetal oxide layer is chosen to be that appropriate for the second level metal wiring lines. Next, a series of photolithography steps are performed to first define a pattern of the second level wiring lines, and then to define a pattern of interconnects within the first level of the interconnect structure. Next, a mask, for example, a photoresist mask, is formed on the intermetal oxide layer where the mask includes a pattern of openings that correspond to the pattern of wiring lines desired for the second level wiring lines. Next, openings are formed in the intermetal oxide layer by etching through the openings in the photoresist mask—the etching step proceeds first through the intermetal oxide layer to leave remaining portions of the intermetal oxide layer between the openings. This first etching steps stops on the silicon nitride layer, and then etching is performed, aligned with the openings, to etch through the silicon nitride layer, leaving remaining portions of the silicon nitride layer on either side of the openings. Next, the photoresist mask is removed by ashing—it is generally necessary for the width of the openings in the patterned intermetal oxide layer to be greater than the lithography resolution limit because further photolithography steps are necessary to define the interconnects of the first level. Next, a photoresist mask is formed over the device by conventional photolithography. Next, openings are provided in the mask that expose selected portions of the first oxide layer lying within the openings. Next, etching is performed on the first oxide layer exposed within the openings in the photoresist mask to define the pattern of interconnects that make up the first level of the interconnect structure. Next, the photoresist mask is removed by ashing. Next, a layer of metal is deposited over the device to fill the openings in the intermetal oxide layer, and to fill the openings in the first oxide layer. Conventionally one overfills the openings in the intermetal oxide layer to ensure that the openings in both the intermetal oxide and the first oxide layer are completely filled. Next, excess metal is removed, typically in a CMP process, to provide the second level metal wiring lines and first level interconnects of the two level interconnect structure—the CMP step provides a planarized surface which is well suited to further processing steps.

In light of the above, there is a need for materials with improved properties for use in, among other things, improving the above-described dual damascene process. For example, there is a need for improvement in film properties such as, for example, and without limitation, one or more of: mechanical properties, thermal stability, dielectric constant, etch selectivity, resistance to isotropic strip processes, and copper diffusion barrier characteristics.

SUMMARY OF THE INVENTION

One or more embodiments of the present invention advantageously satisfy one or more of the above-identified needs in the art. In particular, one embodiment of the present invention is a method for fabricating a low-k dielectric film that comprises steps of: (a) chemical vapor depositing a lower-k dielectric film; and (b) e-beam treating the lower-k dielectric film.

DETAILED DESCRIPTION

In accordance with one or more embodiments of the present invention, one or more film properties such as, for example, and without limitation, mechanical properties, thermal stability, dielectric constant, etch selectivity, resistance to isotropic strip processes (for example, a non-cross-linked polymer may etch easily with an isotropic downstream plasma strip process), and copper diffusion barrier characteristics are improved by electron-beam ("e-beam") treatment. Films whose properties are improved include, for example, and without limitation: (a) lower-k, chemical vapor deposition deposited ("CVD-deposited"), organo-silicon-based films; (b) lower-k, spin-on-deposited ("SOD"), organo-silicon-based films, and (c) CVD-deposited or SOD copper diffusion barrier films, organic anti-reflection coating films, and hard masks, including amorphous carbon-based films. It is believed that, at least in one respect, e-beam treatment provides such improvement because the e-beam treatment acts to dehydrogenatively cross-link the film (i.e., it is believed that the e-beam treatment acts preferentially to remove hydrogen bonds, thereby enabling cross-linking of carbon bonds), thereby densifying and increasing the surface hardness and the Young's modulus of the film. It is further believed that at least in most cases this is accomplished without substantially changing its bulk composition.

As used herein, the term electron-beam or e-beam treatment refers to exposure of a film to a beam of electrons, for example, and without limitation, a relatively uniform beam of electrons. The e-beam may be scanned across a wafer, or the e-beam may be sufficiently broad to encompass a substantial portion, or the entirety, of a wafer (to achieve higher throughput processing it is advantageous to use a large-area or flood beam electron source, to expose the whole substrate simultaneously). The energy of the e-beam during the exposure is such that substantially an entire thickness of a layer of material is exposed to electrons from the e-beam, or predetermined portions of the layer beneath the surface of the layer are exposed to electrons from the e-beam. The exposure may also be accomplished in steps of varying energy to enable the whole layer, or portions of the layer to be exposed at predetermined depths.

Figure 1:
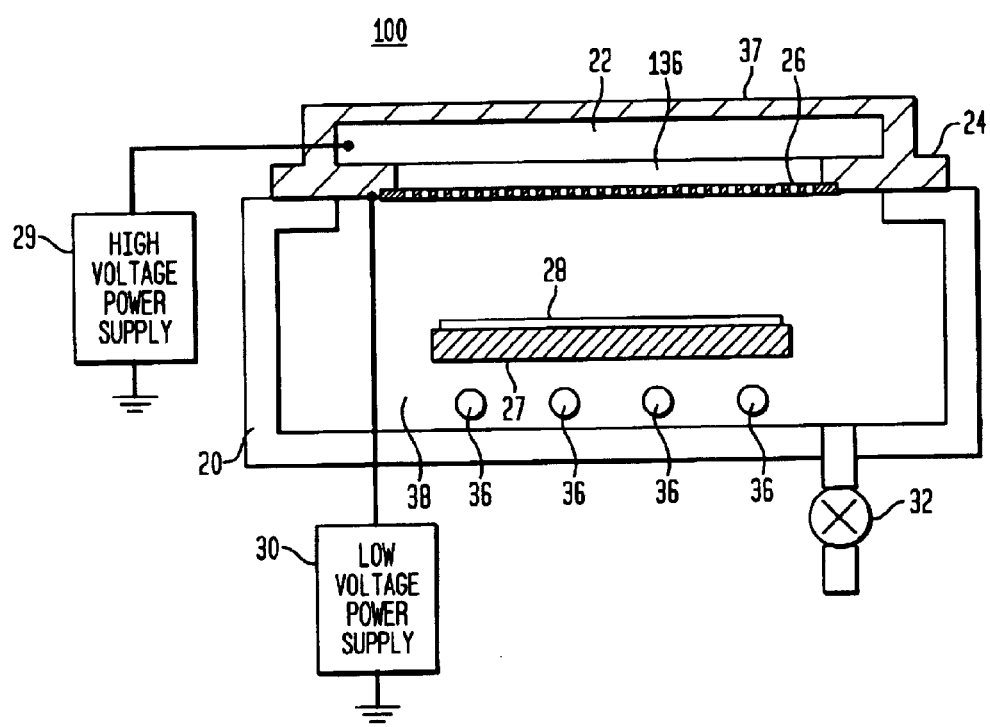
FIG. 1 is a simplified elevational view showing an abeam treatment apparatus including an electron source.

FIG. 1 is a simplified elevational view showing an e-beam treatment apparatus, including an electron source. As shown in FIG. 1, e-beam treatment apparatus 100 includes vacuum chamber 20, large-area cathode 22, target or substrate 27 (with to-be-treated film 28 deposited on target or substrate 27) that is located in field-free region 38, and grid (for example, and without limitation, a fine mesh screen) anode 26 placed between target 27 and cathode 22 at a distance from cathode 22 that is less than the mean free path length of electrons emitted therefrom.

E-beam treatment apparatus 100 further includes high voltage insulator 24 which isolates grid 26 from large-area cathode 22, cathode cover insulator 37 located outside vacuum chamber 20, variable leak valve 32 for controlling pressure inside vacuum chamber 20, variable high voltage power supply 29 connected to cathode 22, and variable low voltage power supply 30 (variable, for example, and without limitation, from about 0 to about 100 volts) connected to grid 26. Lastly, quartz lamps 36 irradiate the bottom side of substrate 27 to provide heating independent of that provided by the electron beam.

In accordance with further embodiments of the present invention, instead of utilizing lamp heating, the wafer or substrate may be disposed on a body that is referred to as a chuck or susceptor. In accordance with such embodiments, the chuck may be resistively heated in a manner that is well known to those of ordinary skill in the art to provide heating independent of that provided by the electron beam. In addition, the chuck may be an electrostatic check (for example, a monopolar or bipolar electrostatic chuck) to provide good contact between the wafer and the chuck. Many methods are well known to those of ordinary skill in the art for fabricating such electrostatic chucks. Further in accordance with such embodiments, a backside gas may be flown between the wafer and the chuck to enhance thermal conductivity between the two in a manner that is well known to those of ordinary skill in the art, such backside gas being flown in one or more zones depending on the need for controlling temperature uniformity. Still further in accordance with such embodiments, a cooling liquid may be flown inside the chuck to be able, for some treatment mechanisms, to reduce the temperature of the wafer in light of heating provided by the electron beam. Many methods are well known to those of ordinary skill in the art for flowing a cooling liquid through a chuck.

In operation, substrate 27 is placed in vacuum chamber 20, and vacuum chamber 20 is pumped to a pressure in a range of, for example, and without limitation, from about 1 to about 200 mTorr. The exact pressure is controlled by variable rate leak valve 32 which is capable of controlling pressure, for example, and without limitation to about ±1 mTorr. A high voltage (for example, a negative voltage between, for example, and without limitation, about −500 volts and about −30,000 volts or higher) at which the treatment is to take place is applied to cathode 22 by high voltage power supply 29. Variable voltage source 30 (for example: a d.c. power supply capable of sourcing or sinking current) is also applied to grid anode 26. The voltage on grid 26 is utilized to control electron emission from cathode 22.

To initiate electron emission, gas in a space between cathode 22 and target 27 must become ionized. This occurs as a result of naturally occurring gamma rays, or emission can instead be initiated artificially inside chamber 20 by a high voltage spark gap. Once this initial ionization takes place, positive ions are attracted to grid 26 by a slightly negative voltage (for example, and without limitation, from about 0 to about −80 volts) being applied to grid 26. These positive ions pass into accelerating field region 136 between cathode 22 and grid anode 26, and are accelerated towards cathode surface 22 as a result of the high voltage applied to cathode 22. Upon striking the surface of cathode 22, these high energy ions produce secondary electrons that are accelerated back toward grid 26. Some of these electrons (which are now traveling mostly perpendicular to the cathode surface) strike grid (anode) structure 26, but may pass through grid 26 and continue on to target 27. These high energy electrons ionize gas molecules in a space between grid 26 and target 27.

Grid 26 is placed at a distance less than the mean free path of electrons emitted by cathode 22. As a result, no significant ionization takes place in accelerating field region 136 between grid 26 and cathode 22. In addition, ions created outside grid 26 are controlled (repelled or attracted) by voltage applied to grid 26. Thus, emission (i.e., electron beam current) can be continuously controlled (from very small currents to very large currents) by varying the voltage on grid 26. Alternatively, electron emission can be controlled by use of variable leak valve 32 which can raise or lower the number of molecules in the ionization region between target 27 and cathode 22. However, due to a relatively slow response time of adjusting pressure in chamber 20, it is netter to adjust the pressure initially to produce a nominal emission current, and then utilize bias voltage on grid 26 to control emission current.

Electron emission can be turned off entirely by applying a positive voltage to grid 26 wherein the positive grid voltage exceeds the energy of any of the positive ion species created in the space between grid 26 and target 27.

Even though the grid-to-cathode gap must be less than the mean free path determined by the lowest desired operating accelerating voltage, treatment apparatus 100 is operated at a vacuum level where the breakdown strength of the vacuum exceeds the field created by the highest operating voltage applied across the selected grid-to-cathode spacing. This low or soft vacuum level enables cathode 22 and target 27 to be placed in close proximity to each other in the same vacuum environment.

Electrons emitted from cathode 22 are accelerated to grid 26, and are mostly traveling perpendicular to the surface of grid 26 and cathode 22. Some emitted electrons are intercepted by grid 26 and some are scattered by grid 26. If target 27 is within a few millimeters of grid 26, electrons will cast an image of grid 26 on target 27. However, if target 27 is placed at a large distance, such as, for example, and without limitation, a distance in a range from about 10 to about 20 centimeters from grid 26, the electron beam diffuses (due to initial transverse velocities and scattering) to a fairly uniform current density across the whole emitting area. The irradiation of target 27 can be made even more uniform by sweeping the beam back and forth across target 27 by means of a time-varying magnetic field produced by deflection coils surrounding vacuum chamber 20. In a further embodiment, an aperture plate or mask is placed between grid 26, and in contact or close proximity with target 27. Since electrons moving toward target 27 are nearly collimated by the accelerating field, and have relatively small transverse velocities, a shadow mask, placed in close proximity to target 27 will be accurately replicated by the electron beam that passes through the mask or aperture plate. In a still further embodiment, a shaped aperture is placed between grid 26 and target 27. This aperture can form a small shaped electron beam having a uniform current density. Target material 27 is then scanned or stepped under the beam to generate multiple patterns on the substrate or target. After exposing a feature of target 27, target 27 is moved, and a new exposure is undertaken.

In some applications, it may be desirable to provide a constant beam current at different electron beam energies. For example it may be desirable to expose or cure an upper layer of film 28, but not a lower or bottom layer. This can be done by utilizing an electron beam energy low enough such that most of the electrons are absorbed in the upper layer of film 28. Subsequent to treating the upper layer, it may be desirable to treat a deeper layer of film 28. This can be done by raising the accelerating voltage of the electron beam to penetrate to the deeper layer. It would be desirable in performing these exposures to be able to alter the accelerating voltage without causing a change in the emission current. However, if the accelerating voltage is increased it tends to cause more ionization and therefore an increase in beam current. Similarly if the accelerating voltage is lowered, ionization lessens and the beam current is decreased. In accordance with one embodiment in which a constant beam current is maintained independent of changes in accelerating voltage, the beam current is sampled via a sensor. An output from the sensor is used to control voltage on grid anode 26 such that an increase in beam current will cause a decrease in bias voltage on grid 26 and a decrease in emission current from cathode 26. The output from the sensor is adjusted so that any change in current caused by a change in the accelerating voltage is counteracted by a change in bias voltage to maintain the beam current reaching the target constant. Alternatively, an output from the sensor can be connected to a voltage controlled variable rate leak valve to counteract changes in emission current by raising or lowering the pressure in ionization region 38.

The depth to which impinging electrons penetrate a target layer before being absorbed depends on many factors (including the particular material which is being treated); one of the most critical of which is the energy of the electron beam as determined by the accelerating voltage. Impinging electrons penetrate the surface of the target relatively easily, and are absorbed principally at some depth below the surface (a peak depth). A lesser number of electrons is absorbed near the surface, and the density of absorbed electrons tapers off gradually to practically zero at a greater depth. As the beam energy (controlled by accelerating voltage) is increased, the peak is driven further from the surface. Thus, one may select a low electron accelerating voltage to expose a top layer of the target without exposing a deeper layer. Further, due to the nature of the electron beam scattering process the lower layer can be exposed to a higher level of electron treatment than the upper layer by selecting a sufficiently high incident beam energy. The total treatment by electrons at a selected level is controlled by the beam current and exposure time. In effect, control of dose and beam energy provides selective control of treatment at selected depths in the target.

In an application where film 28 on substrate 27 is an insulator, film 28 may start to charge negatively under electron bombardment. However, positive ions near the substrate surface will be attracted to this negative charge and neutralize it. Thus, since any charge build up on the surface of the substrate is quickly neutralized by positive ions in the vicinity of the wafer surface, a beam treatment of insulating films may be carried out without requiring a conductive coating to drain off charge. In addition, it is believed that subsurface charge dissipation is achieved by e-beam induced conductivity. Also, it is further believed that the combination of large area electron beam irradiation, and raising the temperature of the treated film in applications where such is the case, increases the electron beam conductivity of insulation layers which dissipate charge build-up created by the impinging electron beam. This enables treatment without inducing electron traps or positive charge build-up in the layers. In addition, it is believed that the e-beam induced conductivity effect is dependent on substrate temperature (becoming more conductive with increasing temperature). This is then taken in to account in developing e-beam treatment recipes to ensure that one does not create static charge.

As shown in FIG. 1, lamps 36 irradiate and heat wafer or substrate 27, thereby controlling its temperature. Since wafer 27 is in a vacuum environment, and is thermally isolated, wafer 27 can be heated or cooled by radiation. If lamps 36 are extinguished, wafer 27 will radiate away its heat to the surrounding surfaces and gently cool. Wafer 27 is simultaneously heated by lamps 36 and irradiated by the electron beam throughout the entire process. For example, in accordance with one embodiment, infrared quartz lamps 36 are on continuously until the temperature of wafer 27 reaches a process operating temperature. Lamps 36 are thereafter turned off and on at varying duty cycle to control the wafer temperature. Wafer 27 and film 28 are continually irradiated with electrons until a sufficient dose has accumulated, and film 28 has been treated. Using this technique, thick layers can be cured in, for example, and without limitation, in less than ten minutes.

In accordance with further embodiments of the present invention, infrared lamps 36 are not used to heat wafer 27. In accordance with such embodiments, the electron beam is used to both irradiate and heat wafer 27. In this case the product of the beam current and the beam voltage (power= current*voltage) is greater than the power radiated away by the wafer, and therefore wafer 27 is heated by the electron beam. In accordance with further embodiments of the present invention, wafer or substrate 27 can be cooled using a cooled plate. This will keep wafer or substrate 27 close to a predetermined temperature.

In accordance with one or more further embodiments of the present invention, cathode 22 is comprised of, or is coated with, one or more of Ti, Mo, and doped Si to provide enhanced secondary electron formation and reduced sputtering of cathode 22. In accordance with one or more still further embodiments of the present invention, grid 26 is comprised of, or is coated with, one or more of Ti, Mo, and graphite to reduce an incubation period used to prepare the chamber for operation.

Process conditions for e-beam treatment include the following. The pressure in vacuum chamber 20 may vary in a range of from about $10^{-5}$ to about $10^2$ Torr, and preferably in a range of from about $10^{-3}$ to $10^{-1}$ Torr. The distance between substrate 27 and grid anode 26 should be sufficient for electrons to generate ions in their transit between grid anode 26 and the surface of substrate 27. The temperature of wafer 27 may vary in a range from about 0° C. to about 1050° C. The electron beam energy may vary in a range from about 0.1 to about 100 KeV. The total dose of electrons may vary in a range from about 1 to about 100,000 $\mu C/cm^2$. The dose and energy selected will be proportional to the thickness of the films to be treated. The gas ambient in e-beam tool apparatus may be any of the following gases: nitrogen, oxygen, hydrogen, argon, helium, ammonia, silane, xenon or any combination of these gases. The electron beam current may vary in a range from about 0.1 to about 100 mA. Preferably, the e-beam treatment is conducted with a wide, large beam of electrons from a uniform large-area electron beam source which covers the surface area of the film to be treated. In addition, for thick films, the electron beam dose may be divided into steps of decreasing voltage which provides a uniform dose process in which the material is cured from the bottom up. Thus, the depth of electron beam penetration may be varied during the treatment process. The length of the treatment may range from about 0.5 minute to about 120 minutes As those of ordinary skill in the art can readily appreciate, the length of e-beam treatment may depend one or more of the above-identified parameters, and that particular sets of parameters can be determined routinely without undue experimentation in light of the detailed description presented herein.

Processes to Produce E-Beam Treated Films
Processes to Produce Low-k Dielectric Films Using a Chemical Vapor Deposition ("CVD") Step: Approach 1 (Deposit a Low-k Film, and E-Beam Treat it to Improve, for Example, its Mechanical Properties)

In accordance with one or more embodiments of the present invention, in a first step of a method of producing a look dielectric film, a lower-k dielectric film is deposited using a CVD deposition process (in the manner described in detail below), which lower-k dielectric film may contain a predetermined porosity. Normally, such a CVD-deposited film would be soft, and contain metastable species. When such a CVD-deposited film is thermally annealed, metastable species are driven off, and the film shrinks—such a film might have a k value of ~2.6. In the prior art, a plasma anneal process has been used to reduce the time it takes to carry out a thermal anneal by exposing the film to a plasma environment. However, this prior art plasma anneal process is ineffective because its effect is limited to the surface of the film. Next, in accordance with this embodiment of the present invention, in a second step of the method of producing a low-k dielectric film, an e-beam treatment (including heating the film at the same time) is carried out on the CVD-deposited film to convert it into a hard, heavily cross-linked film. Finally, in accordance with this embodiment of the present invention, in an optional third step of the method of producing a low-k dielectric film, the e-beam treated film may be thermally annealed. Advantageously, e-beam treating the CVD-deposited film strengthens the structure of the film while driving out metastable species to prevent shrinking.

CVD Deposition of Lower-k Dielectric Films

One embodiment of a method for depositing a lower dielectric constant film containing silicon, oxygen, and carbon entails the use of a precursor comprised of one or more cyclic organo-silicon-based compounds. Further such embodiments entail blending one or more cyclic organo-silicon-based compounds and one or more acyclic organo-silicon compounds. In one aspect, a cyclic organo-silicon compound, an acyclic organo-silicon, and a hydrocarbon compound are reacted with an oxidizing gas at conditions sufficient to form a low dielectric constant film having k less than 2.5. The cyclic organo-silicon compound includes at least one silicon-carbon bond. The acyclic organo-silicon compound includes, for example, and without limitation, a silicon-hydrogen bond or a silicon-oxygen bond. The hydrocarbon could be linear or cyclic, and may include a carbon-carbon double or triple bond. In accordance with one or more embodiments of the present invention, if at least one the organo-silicon gases contains oxygen, one may not need an oxidizing gas.

The CVD films contain a network of —Si—O—Si— ring structures that are cross-linked with one or more linear organic compounds. Because of the cross-linkage, a reactively stable network is produced having a greater separation between ring structures and thus, the deposited films possess a greater degree of porosity.

The films also contain a carbon content between about 10 and about 30 atomic percent (excluding hydrogen atoms), preferably between about 10 and about 20 atomic percent. The carbon content of the deposited films refers to atomic analysis of the film structure which typically does not contain significant amounts of non-bonded hydrocarbons. The carbon contents are represented by the percent of carbon atoms in the deposited film, excluding hydrogen atoms which are difficult to quantify. For example, a film having an average of one silicon atom, one oxygen atom, one carbon atom and two hydrogen atoms has a carbon content of 20 atomic percent (one carbon atom per five total atoms), or a carbon content of 33 atomic percent excluding hydrogen atoms (one carbon atom per three total atoms).

The cyclic organo-silicon compounds may include a ring structure having three or more silicon atoms, and the ring structure may further comprise one or more oxygen atoms. Commercially available cyclic organo-silicon compounds include rings having alternating silicon and oxygen atoms with one or two alkyl groups bonded to the silicon atoms. For example, the cyclic organo-silicon compounds may include one or more of the following compounds:

| | |
|---|---|
| 1,3,5-trisilano-2,4,6-trimethylene | -(—SiH$_2$CH$_2$—)$_3$- (cyclic) |
| 1,3,5,7-tetramethylcyclotetrasiloxane (TMCTS) | -(—SiHCH$_3$—O—)$_4$- (cyclic) |
| octamethylcyclotetrasiloxane (OMCTS) | -(—Si(CH$_3$)$_2$—O—)$_4$- (cyclic) |
| 1,3,5,7,9-pentamethylcyclopentasiloxane | -(—SiHCH$_3$—O—)$_5$- (cyclic) |
| 1,3,5,7-tetrasilano-2,6-dioxy-4,8-dimethylene | -(—SiH$_2$—CH$_2$—SiH$_2$—O—)$_2$- (cyclic) |
| hexamethylcyclotrisiloxane | -(—Si(CH$_3$)$_2$—O—)$_3$- (cyclic) |

The acyclic organo-silicon compounds include linear or branched (i.e. acyclic) organo-silicon compounds having one or more silicon atoms and one or more carbon atoms and linear or branched hydrocarbon compounds having at least one unsaturated carbon bond. The structures may further contain oxygen. Commercially available acyclic organo-silicon compounds include organo-silanes that do not contain oxygen between silicon atoms and organo-siloxanes which contain oxygen between two or more silicon atoms. For example, the acyclic organo-silicon compounds may include one or more of the following compounds:

| | |
|---|---|
| methylsilane | CH$_3$—SiH$_3$ |
| dimethylsilane | (CH$_3$)$_2$—SiH$_2$ |
| trimethylsilane | (CH$_3$)$_3$—SiH |
| tetramethylsilane | (CH$_3$)$_4$—Si |
| dimethyldimethoxysilane (DMDMOS) | (CH$_3$)$_2$—Si—(OCH$_3$)$_2$ |
| ethylsilane | CH$_3$—CH$_2$—SiH$_3$ |
| disilanomethane | SiH$_3$—CH$_2$—SiH$_3$ |
| bis(methylsilano)methane | CH$_3$—SiH$_2$—CH$_2$—SiH$_2$—CH$_3$ |
| 1,2-disilanoethane | SiH$_3$—CH$_2$—CH$_2$—SiH$_3$ |
| 1,2-bis(methylsilano)ethane | CH$_3$—SiH$_2$—CH$_2$—CH$_2$—SiH$_2$—CH$_3$ |
| 2,2-disilanopropane | SiH$_3$—C(CH$_3$)$_2$—SiH$_3$ |
| 1,3-dimethyldisiloxane | CH$_3$—SiH$_2$—O—SiH$_2$—CH$_3$ |
| 1,1,3,3-tetramethyldisiloxane (TMDSO) | (CH$_3$)$_2$—SiH—O—SiH—(CH$_3$)$_2$ |
| hexamethyldisiloxane (HMDS) | (CH$_3$)$_3$—Si—O—Si—(CH$_3$)$_3$ |
| 1,3-bis(silanomethylene)disiloxane | (SiH$_3$—CH$_2$—SiH$_2$—)$_2$—O |
| bis(1-methyldisiloxanyl)methane | (CH$_3$—SiH$_2$—O—SiH$_2$—)$_2$—CH$_2$ |
| 2,2-bis(1-methyldisiloxanyl)propane | (CH$_3$—SiH$_2$—O—SiH$_2$—)$_2$—C(CH$_3$)$_2$ |
| hexamethoxydisiloxane (HMDOS) | (CH$_3$O)$_3$—Si—O—Si—(OCH$_3$)$_3$ |
| diethylsilane | ((C$_2$H$_5$)$_2$SiH$_2$) |
| propylsilane | (C$_3$H$_7$SiH$_3$) |
| vinylmethylsilane | (CH$_2$=CH)CH$_3$SiH$_2$) |
| 1,1,2,2-tetramethyldisilane | (HSi(CH$_3$)$_2$—Si(CH$_3$)$_2$H) |
| hexamethyldisilane | ((CH$_3$)$_3$Si—Si(CH$_3$)$_3$) |
| 1,1,2,2,3,3-hexamethyltrisilane | (H(CH$_3$)$_2$Si—Si(CH$_3$)$_2$—SiH(CH$_3$)$_2$) |
| 1,1,2,3,3-pentamethyltrisilane | (H(CH$_3$)$_2$Si—SiH(CH$_3$)—SiH(CH$_3$)$_2$) |
| dimethyldisilanoethane | (CH$_3$—SiH$_2$—(CH$_2$)$_2$—SiH$_2$—CH$_3$) |
| dimethyldisilanopropane | (CH$_3$—SiH—(CH$_2$)$_3$—SiH—CH$_3$) |
| tetramethyldisilanoethane | ((CH)$_2$—SiH—(CH$_2$)$_2$—SiH—(CH)$_2$) |
| tetramethyldisilanopropane | ((CH$_3$)$_2$—Si—(CH$_2$)$_3$—Si—(CH$_3$)$_2$) |

The linear or branched hydrocarbon compounds include between one and about 20 adjacent carbon atoms. The hydrocarbon compounds can include adjacent carbon atoms that are bonded by any combination of single, double, and triple bonds. For example, the organic compounds may include alkenes having two to about 20 carbon atoms, such as ethylene, propylene, acetylene, butadiene, t-butylethylene, 1,1,3,3-tetramethylbutylbenzene, t-butylether, methyl-methacrylate (MMA), and t-butylfurfurylether.

Some of the above-described precursors contain oxygen, therefore an additional oxidizer may not be needed. However, in case one or more oxidizing gases or liquids are needed, they may include oxygen (O$_2$), ozone (O$_3$), nitrous oxide (N$_2$O), carbon monoxide (CO), carbon dioxide (CO$_2$), water (H$_2$O), hydrogen peroxide (H$_2$O$_2$), an oxygen-containing organic compound, or combinations thereof. Preferably, the oxidizing gas is oxygen gas. However, when ozone is used as an oxidizing gas, an ozone generator converts from 6% to 20%, typically about 15%, by weight of the oxygen in a source gas to ozone, with the remainder typically being oxygen. Yet, the ozone concentration may be increased or decreased based upon the amount of ozone desired and the type of ozone generating equipment used. The one or more oxidizing gases are added to the reactive gas mixture to increase reactivity and achieve the desired carbon content in the deposited film.

Deposition of the ultra low dielectric constant film can be continuous or discontinuous in a single deposition chamber. Alternatively, the film can be deposited sequentially in two or more deposition chambers, such as within a cluster tool like the Producer™ available from Applied Materials, Inc. of Santa Clara, Calif.

Figure 2:
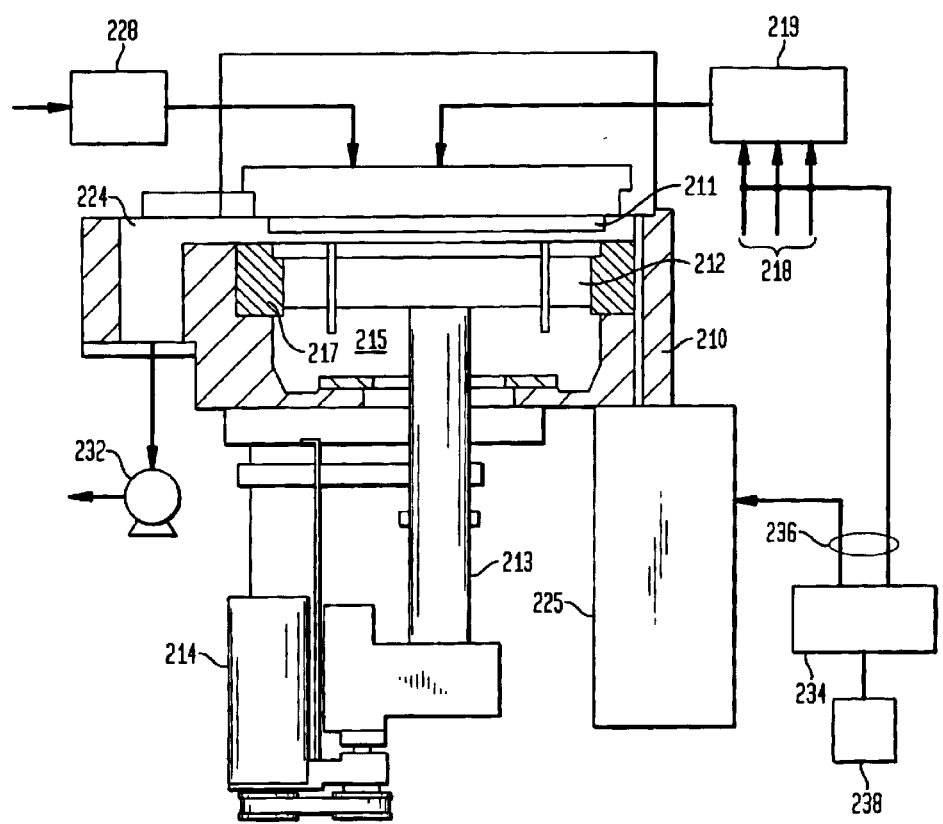
FIG. 2 is a cross-sectional diagram of an exemplary CVD reactor configured for use according to embodiments described herein.

FIG. 2 shows a vertical, cross-section view of parallel plate chemical vapor deposition (CVD) processing chamber 210 having a high vacuum region 215. Processing chamber 10 contains gas distribution manifold 211 having perforated holes for dispersing process gases therethrough to a substrate (not shown). The substrate rests on substrate support plate or susceptor 212. Susceptor 212 is mounted on support stem 213 that connects susceptor 212 to lift motor 214. Lift motor 214 raises and lowers susceptor 212 between a processing position and a lower, substrate-loading position so that susceptor 212 (and the substrate supported on the upper surface of susceptor 212) can be controllably moved between a lower loading/off-loading position and an upper processing position which is closely adjacent to manifold 211. Insulator 217 surrounds susceptor 212 and the substrate when in an upper processing position.

During processing, gases introduced to manifold 211 are uniformly distributed radially across the surface of the substrate. Vacuum pump 232 having a throttle valve controls the exhaust rate of gases from chamber 210 through manifold 224. Deposition and carrier gases flow through gas lines 218 into mixing system 219 and then to manifold 211. Generally, each process gas supply line 218 includes (i) safety shut-off valves (not shown) that can be used to automatically or manually shut off the flow of process gas into the chamber, and (ii) mass flow controllers (also not shown) to measure the flow of gas through gas supply lines 218. When toxic gases are used in the process, several safety shut-off valves are positioned on each gas supply line 18 in conventional configurations.

During deposition, a blend/mixture of one or more cyclic organo-silicon compounds and one or more acyclic organo-silicon compounds are reacted with an oxidizing gas to form a low k film on the substrate. In accordance with one such embodiment, the cyclic organo-silicon compounds are combined with at least one acyclic organo-silicon compound and at least one hydrocarbon compound. For example, the mixture contains about 5 percent by volume to about 80 percent by volume of the one or more cyclic organo-silicon compounds, about 5 percent by volume to about 15 percent by volume of the one or more acyclic organo-silicon compounds, and about 5 percent by volume to about 45 percent by volume of the one or more hydrocarbon compounds. The mixture also contains about 5 percent by volume to about 20 percent by volume of the one or more oxidizing gases. In accordance with one such embodiment, the mixture contains about 45 percent by volume to about 60 percent by volume of one or more cyclic organo-silicon compounds, about 5 percent by volume to about 10 percent by volume of one or more acyclic organo-silicon compounds, and about 5 percent by volume to about 35 percent by volume of one or more hydrocarbon compounds.

In one aspect, the one or more cyclic organo-silicon compounds are introduced to mixing system 19 at a flow rate of about 1,000 to about 10,000 mgm, and in accordance with one embodiment, about 5,000 mgm. The one or more acyclic organo-silicon compounds are introduced to mixing system 19 at a flow rate of about 200 to about 2,000, and in accordance with one embodiment, about 700 sccm. The one or more hydrocarbon compounds are introduced to the mixing system 219 at a flow rate of about 100 to about 10,000 sccm, and in accordance with one embodiment, 1,000 sccm. The oxygen containing gas has a flow rate between about 200 and about 5,000 sccm. In accordance with one embodiment, the cyclic organo-silicon compound is 2,4,6,8-tetramethylcyclotetrasiloxane, octamethylcyclotetrasiloxane, or a mixture thereof, and the acyclic organo-silicon compound is trimethylsilane, 1,1,3,3-tetramethyldisiloxane, or a mixture thereof. In accordance with one embodiment, the hydrocarbon compound is ethylene.

The deposition process can be either a thermal process or a plasma enhanced process. In a plasma enhanced process, a controlled plasma is typically formed adjacent the substrate by RF energy applied to gas distribution manifold 211 using RF power supply 225. Alternatively, RF power can be provided to susceptor 212. The RF power to the deposition chamber may be cycled or pulsed to reduce heating of the substrate and promote greater porosity in the deposited film. The power density of the plasma for a 200 mm substrate is between about 0.03 W/cm$^2$ and about 3.2 W/cm$^2$, which corresponds to a RF power level of about 10 W to about 2000 W. In accordance with one embodiment, the RF power level is between about 300 W and about 1700 W.

RF power supply 225 can supply a single frequency RF power between about 0.01 MHz and 300 MHz. Alternatively, the RF power may be delivered using mixed, simultaneous frequencies to enhance the decomposition of reactive species introduced into high vacuum region 215. In one aspect, the mixed frequency is a lower frequency of about 12 kHz and a higher frequency of about 13.56 MHz. In another aspect, the lower frequency may range between about 300 Hz to about 1,000 kHz, and the higher frequency may range between about 5 MHz and about 50 MHz.

During deposition, the substrate is maintained at a temperature between about −20° C. and about 500° C., and in accordance with one embodiment, between about 100° C. and about 400° C. The deposition pressure is typically between about 1 Torr and about 20 Torr, and in accordance with one embodiment, between about 4 Torr and about 6 Torr. The deposition rate is typically between about 10,000 Å/min and about 20,000 Å/min.

When additional dissociation of the oxidizing gas is desired, an optional microwave chamber 228 can be used to input from between about 0 Watts and about 6000 Watts to the oxidizing gas prior to the gas's entering processing chamber 210. The additional microwave power can avoid excessive dissociation of the organo-silicon compounds prior to reaction with the oxidizing gas. A gas distribution plate (not shown) having separate passages for the organo-silicon compound and the oxidizing gas is preferred when microwave power is added to the oxidizing gas.

Typically, any or all of the chamber lining, distribution manifold 211, susceptor 212, and various other reactor hardware is made out of materials such as aluminum or anodized aluminum. An example of such a CVD reactor is described in U.S. Pat. No. 5,000,113, entitled "A Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention.

System controller 234 controls motor 214, gas mixing system 219, and RF power supply 225 which are connected therewith by control lines 236. System controller 34 controls the activities of the CVD reactor and typically includes a hard disk drive, a floppy disk drive, and a card rack. The card rack contains a single board computer (SBC), analog and digital input/output boards, interface boards, and stepper motor controller boards. System controller 34 conforms to the Versa Modular Europeans (VME) standard which defines board, card cage, and connector dimensions and types. The VME standard also defines the bus structure having a 16-bit data bus and 24-bit address bus.

Figure 3:
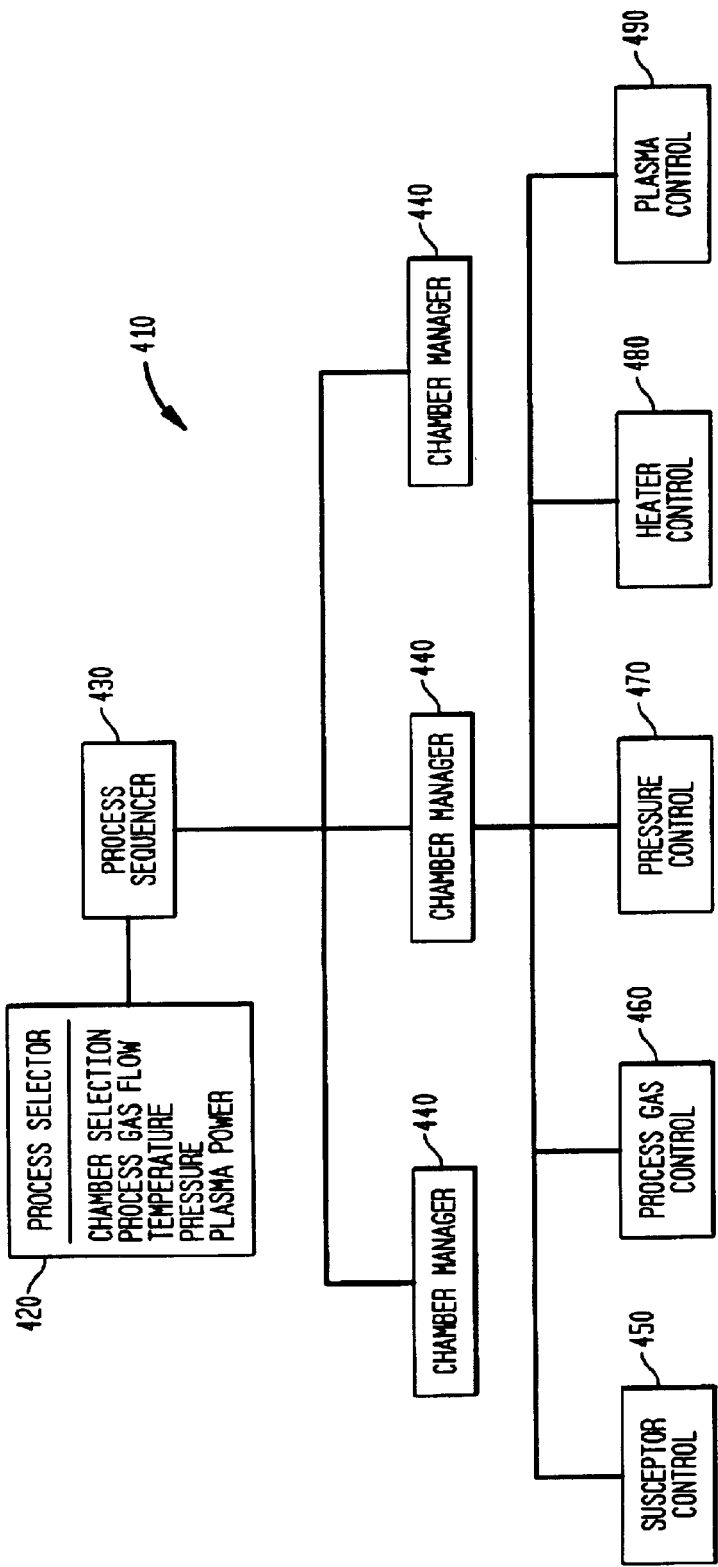
FIG. 3 is a flow chart of a process control computer program product used in conjunction with the exemplary CVD reactor of FIG. 1.

FIG. 3 shows an illustrative block diagram of a hierarchical control structure of computer program 410. System controller 234 operates under the control of computer program 410 stored on hard disk drive 238. Computer program 410 dictates the timing, mixture of gases, RF power levels, susceptor position, and other parameters of a particular process. The computer program code can be written in any conventional computer readable programming language such as, for example, 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of pre-compiled windows library routines. To execute the linked compiled object code, the system user invokes the object code, causing the computer system to load the code in memory, from which the CPU reads and executes the code to perform the tasks identified in the program.

A user enters a process set number and process chamber number into process selector 420 in response to menus or screens displayed on the CRT monitor by using the light pen interface. The process sets are predetermined sets of process parameters necessary to carry out specified processes, and are identified by predefined set numbers. Process selector 420: (i) selects a desired process chamber on the cluster tool, and (ii) selects a desired set of process parameters needed to operate the process chamber for performing the desired process. The process parameters for performing a specific process are provided to the user in the form of a recipe and relate to process conditions such as, for example, process gas composition, flow rates, temperature, pressure, plasma conditions such as RF bias power levels and magnetic field power levels, cooling gas pressure, and chamber wall temperature. The parameters specified by the recipe are entered utilizing the light pen/CRT monitor interface. The signals for monitoring the process are provided by the analog input and digital input boards of system controller 234 and the signals for controlling the process are output to the analog output and digital output boards of system controller 234.

Process sequencer 430 comprises program code for accepting the identified process chamber and set of process parameters from process selector 420, and for controlling operation of the various process chambers. Multiple users can enter process set numbers and process chamber numbers, or a user can enter multiple process chamber numbers, so process sequencer 430 operates to schedule the selected processes in the desired sequence. In accordance with one embodiment, process sequencer 430 includes computer readable program code to perform steps of: (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling a process execute, process sequencer 430 can be designed to take into consideration the present condition of the process chamber being used in comparison with the desired process conditions for a selected process, or the "age" of each particular user entered request, or any other relevant factor a system programmer desires to include for determining the scheduling priorities.

Once process sequencer 430 determines which process chamber and process set combination is going to be executed next, process sequencer 430 causes execution of the process set by passing the particular process set parameters to chamber manager 440 which controls multiple processing tasks in a process chamber according to the process set determined by process sequencer 430. For example, chamber manager 440 includes program code for controlling CVD process operations in process chamber 210. Chamber manager 440 also controls execution of various chamber components which control operation of the chamber component necessary to carry out the selected process set. Examples of chamber component are susceptor control 450, process gas control 460, pressure control 470, heater control 480, and plasma control 490. Those having ordinary skill in the art would readily recognize that other chamber controls can be included depending on what processes are desired to be performed in a processing chamber.

In operation, chamber manager 440 selectively schedules or calls the process component in accordance with the particular process set being executed. Chamber manager 440 schedules the process components in a manner that is similar to the manner in which sequencer 430 schedules which process chamber and process set is to be executed next. Typically, chamber manager 440 includes steps of monitoring the various chamber components, determining which components needs to be operated based on the process parameters for the process set to be executed, and causing execution of a chamber component responsive to the monitoring and determining steps.

Operation of particular chamber components will now be described with reference to FIG. 2. Susceptor control positioning 450 comprises program code for controlling chamber components that are used to load the substrate onto susceptor 212, and optionally to lift the substrate to a desired height in processing chamber 210 to control the spacing between the substrate and gas distribution manifold 211. When a substrate is loaded into processing chamber 210, susceptor 212 is lowered to receive the substrate, and thereafter, susceptor 212 is raised to the desired height in the chamber to maintain the substrate at a first distance or spacing from gas distribution manifold 211 during the CVD process. In operation, susceptor control 450 controls movement of susceptor 212 in response to process set parameters that are transferred from chamber manager 440.

Process gas control 460 has program code for controlling process gas compositions and flow rates. Process gas control 460 controls the open/close position of the safety shut-off valves, and also ramps up/down the mass flow controllers to obtain the desired gas flow rate. Process gas control 460 is invoked by chamber manager 440, as are all chamber components, and receives from the chamber manager process parameters related to the desired gas flow rates. Typically, process gas control 460 operates by opening the gas supply lines, and repeatedly: (i) reading the necessary mass flow controllers, (ii) comparing the readings to the desired flow rates received from chamber manager 440, and (iii) adjusting the flow rates of the gas supply lines as necessary. Furthermore, process gas control 460 includes steps for monitoring the gas flow rates for unsafe rates, and activating the safety shut-off valves when an unsafe condition is detected.

In some processes, an inert gas such as helium or argon is put into processing chamber 210 to stabilize the pressure in the chamber before reactive process gases are introduced. For these processes, process gas control 460 is programmed to include steps for flowing the inert gas into chamber 210 for an amount of time necessary to stabilize the pressure in the chamber, and then the steps described above would be carried out.

Additionally, when a process gas is to be vaporized from a liquid precursor, such as OMCTS for example, process gas control 460 would be written to include steps for bubbling a carrier/delivery gas such as argon, helium, nitrogen, hydrogen, carbon dioxide, ethylene, or mixtures thereof, for example, through the liquid precursor in a bubbler assembly. For this type of process, process gas control 460 regulates the flow of the delivery gas, the pressure in the bubbler, and the bubbler temperature in order to obtain the desired process gas flow rates. As discussed above, the desired process gas flow rates are transferred to process gas control 460 as process parameters. Furthermore, process gas control 460 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

Pressure control 470 comprises program code for controlling the pressure in processing chamber 210 by regulating the size of the opening of the throttle valve in exhaust pump 232. The size of the opening of the throttle valve is set to control the chamber pressure to the desired level in relation to the total process gas flow, size of the process chamber, and pumping set point pressure for the exhaust pump 232. When pressure control 470 is invoked, the desired, or target pressure level is received as a parameter from chamber manager 440. Pressure control 470 operates to measure the pressure in processing chamber 210 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, pressure control 470 can be written to open or close the throttle valve to a particular opening size to regulate the processing chamber 210 to the desired pressure.

Heater control 480 comprises program code for controlling the temperature of the heat modules or radiated heat that is used to heat susceptor 212. Heater control 480 is also invoked by chamber manager 440, and receives a target, or set point, temperature parameter. Heater control 480 measures the temperature by measuring voltage output of a thermocouple located in susceptor 212, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. Heater control 480 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if processing chamber 10 is not properly set up.

Plasma control 490 comprises program code for setting the RF bias voltage power level applied to the process electrodes in processing chamber 210, and optionally, to set the level of the magnetic field generated in the reactor. Similar to the previously described chamber components, plasma control 490 is invoked by chamber manager 440.

The pretreatment and method for forming a pretreated layer of the present invention is not limited to any specific apparatus or to any specific plasma excitation method. The above CVD system description is mainly for illustrative purposes, and other CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the substrate could be supported and heated by a resistively heated susceptor.

The following examples illustrate the lower-k dielectric films that were deposited using the above-described CVD chamber. In particular, the films were deposited using a "Producer" system, which is available from Applied Materials, Inc. of Santa Clara, Calif.

EXAMPLE 1

A low dielectric constant film was deposited on a 200 mm substrate from the following reactive gases at a chamber pressure of about 6 Torr and substrate temperature of about 400° C.

Octamethylcyclotetrasiloxane (OMCTS), at about 5,000 mgm;

Trimethylsilane (TMS), at about 200 sccm;

Ethylene, at about 2,000 sccm;

Oxygen, at about 1,000 sccm; and

Helium, at about 1,000 sccm

The substrate was positioned 1,050 mils from the gas distribution showerhead. A power level of about 800 W at a frequency of 13.56 MHz was applied to the showerhead for plasma enhanced deposition of the film. The film was deposited at a rate of about 12,000 Å/min, and had a dielectric constant (k) of about 2.54 measured at 0.1 MHz.

EXAMPLE 2

A low dielectric constant film was deposited on a 200 mm substrate from the following reactive gases at a chamber pressure of about 6 Torr and substrate temperature of about 400° C.

Octamethylcyclotetrasiloxane (OMCTS), at about 5,000 mgm;

Trimethylsilane (TMS), at about 400 sccm;

Ethylene, at about 2,000 sccm;

Oxygen, at about 1,000 sccm; and

Helium, at about 1,000 sccm;

The substrate was positioned 1,050 mils from the gas distribution showerhead. A power level of about 800 W at a frequency of 13.56 MHz was applied to the showerhead for plasma enhanced deposition of the film. The film was deposited at a rate of about 12,000 Å/min, and had a dielectric constant (k) of about 2.51 measured at 0.1 MHz.

EXAMPLE 3

A low dielectric constant film was deposited on a 200 mm substrate from the following reactive gases at a chamber pressure of about 6 Torr and substrate temperature of about 400° C.

Octamethylcyclotetrasiloxane (OMCTS), at about 5,000 mgm;

Trimethylsilane (TMS), at about 600 sccm;

Ethylene, at about 2,000 sccm;

Oxygen, at about 1,000 sccm; and

Helium, at about 1,000 sccm

The substrate was positioned 1,050 mils from the gas distribution showerhead. A power level of about 800 W at a frequency of 13.56 MHz was applied to the showerhead for plasma enhanced deposition of the film. The film was deposited at a rate of about 12,000 Å/min, and had a dielectric constant (k) of about 2.47 measured at 0.1 MHz.

EXAMPLE 4

A low dielectric constant film was deposited on a 200 mm substrate from the following reactive gases at a chamber pressure of about 6 Torr and substrate temperature of about 400° C.

Octamethylcyclotetrasiloxane (OMCTS), at about 5,000 mgm;

Trimethylsilane (TMS), at about 800 sccm;

Ethylene, at about 2,000 sccm;

Oxygen, at about 1,000 sccm; and

Helium, at about 1,000 sccm

The substrate was positioned 1,050 mils from the gas distribution showerhead. A power level of about 800 W at a frequency of 13.56 MHz was applied to the showerhead for plasma enhanced deposition of the film. The film was deposited at a rate of about 12,000 Å/min, and had a dielectric constant (k) of about 2.47 measured at 0.1 MHz.

EXAMPLE 5

A low dielectric constant film was deposited on a 200 mm substrate from the following reactive gases at a chamber pressure of about 6 Torr and substrate temperature of about 400° C.

Octamethylcyclotetrasiloxane (OMCTS), at about 5,000 mgm;

Trimethylsilane (TMS), at about 900 sccm;

Ethylene, at about 2,000 sccm;

Oxygen, at about 1,000 sccm; and

Helium, at about 1,000 sccm

The substrate was positioned 1,050 mils from the gas distribution showerhead. A power level of about 800 W at a frequency of 13.56 MHz was applied to the showerhead for plasma enhanced deposition of the film. The film was deposited at a rate of about 12,000 Å/min, and had a dielectric constant (k) of about 2.48 measured at 0.1 MHz.

EXAMPLE 6

A low dielectric constant film was deposited on a substrate from the following reactive gases at a chamber pressure of about 14 Torr and substrate temperature of 350° C.

Octamethylcyclotetrasiloxane (OMCTS), at about 2,000 mgm;

Trimethylesilane (TMS), at about 400 sccm;

Oxygen, at about 600 sccm; and

Helium, at about 800 sccm

The substrate was positioned 450 mils from the gas distribution showerhead. A power level of about 800 W at a frequency of 13.56 MHz was applied to the showerhead for plasma enhanced deposition of the film. The deposited film had a dielectric constant (k) of about 2.67 measured at 0.1 MHz.

EXAMPLE 7

A low dielectric constant film was deposited on a substrate from the following reactive gases at a chamber pressure of about 6 Torr and substrate temperature of 400° C.

Octamethylcyclotetrasiloxane (OMCTS), at about 5,000 mgm;

Ethylene, at about 2,000 sccm;

Oxygen, at about 1,000 sccm; and

Helium, at about 1,000 sccm

The substrate was positioned 1,050 mils from the gas distribution showerhead. A power level of 800 W at a frequency of 13.56 MHz was applied to the showerhead for plasma enhanced deposition of the film. The deposited film had a dielectric constant (k) of about 2.55 measured at 0.1 MHz.

Figure 4:
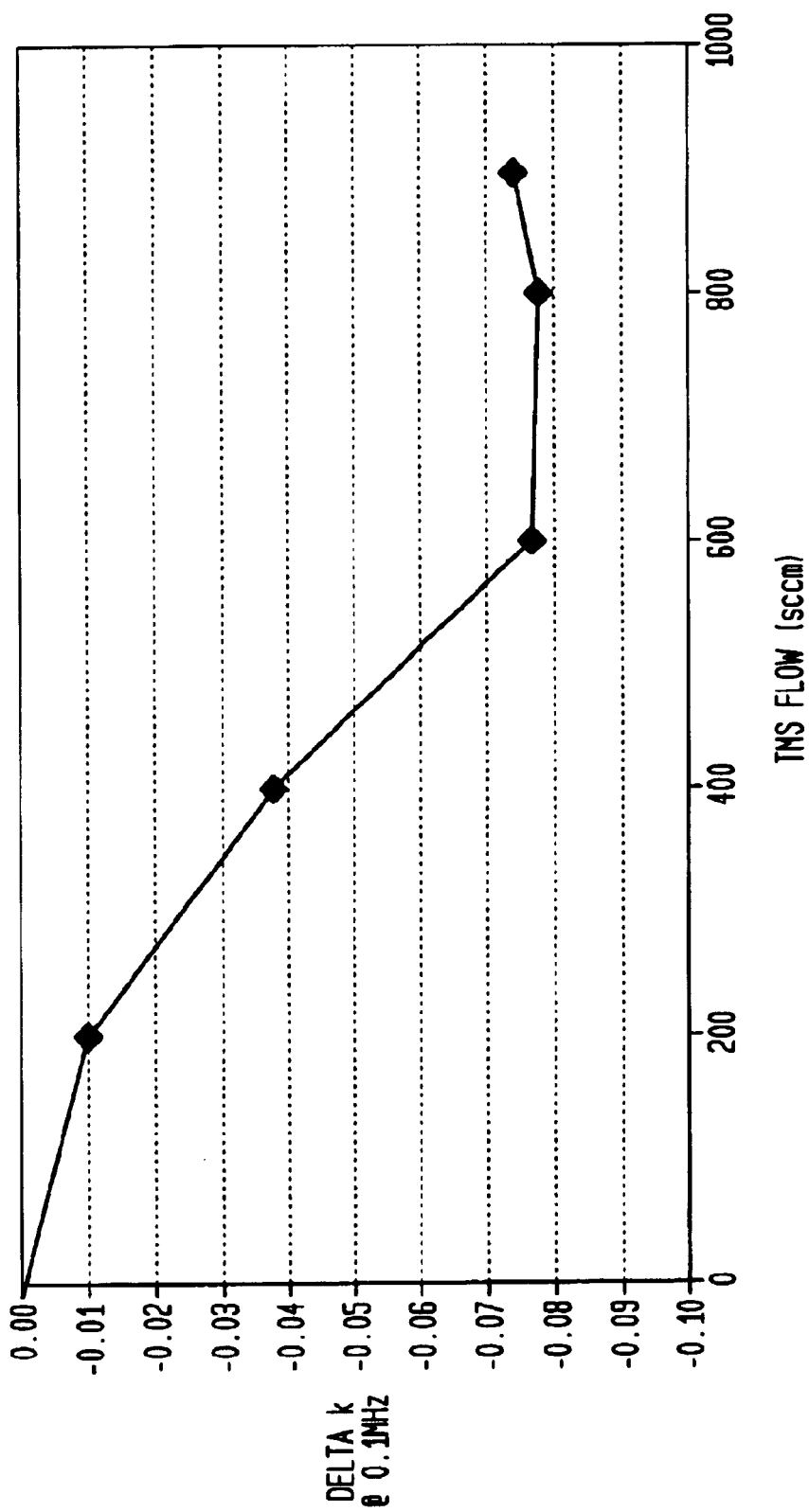
FIG. 4 is a graph that illustrates the effect of varying a flow rate of TMS in accordance with embodiments wherein a chemical vapor deposition ("CVD") deposited film is e-beam treated.
Figure 5:
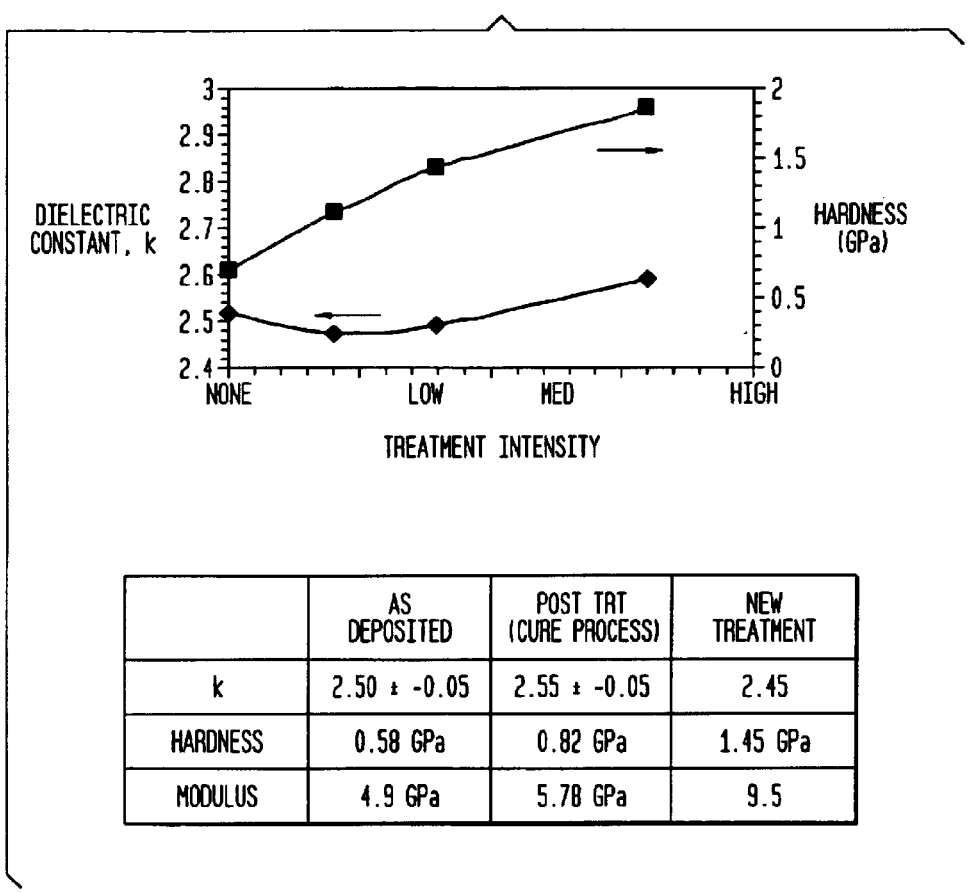
FIGS. 5 and 6 show the effects of abeam treatment of Formulation II described herein.
Figure 6:
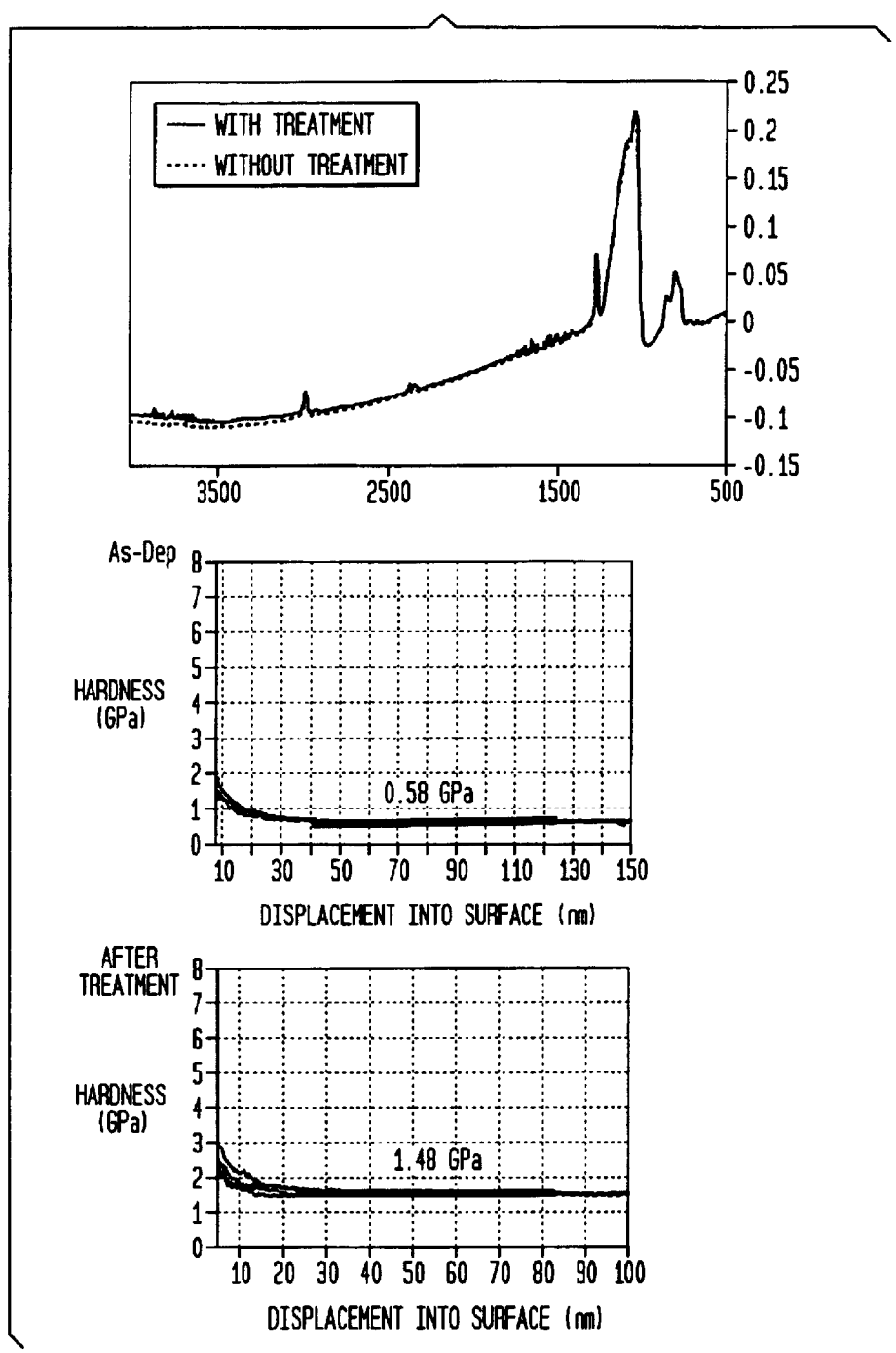
Figure 7:
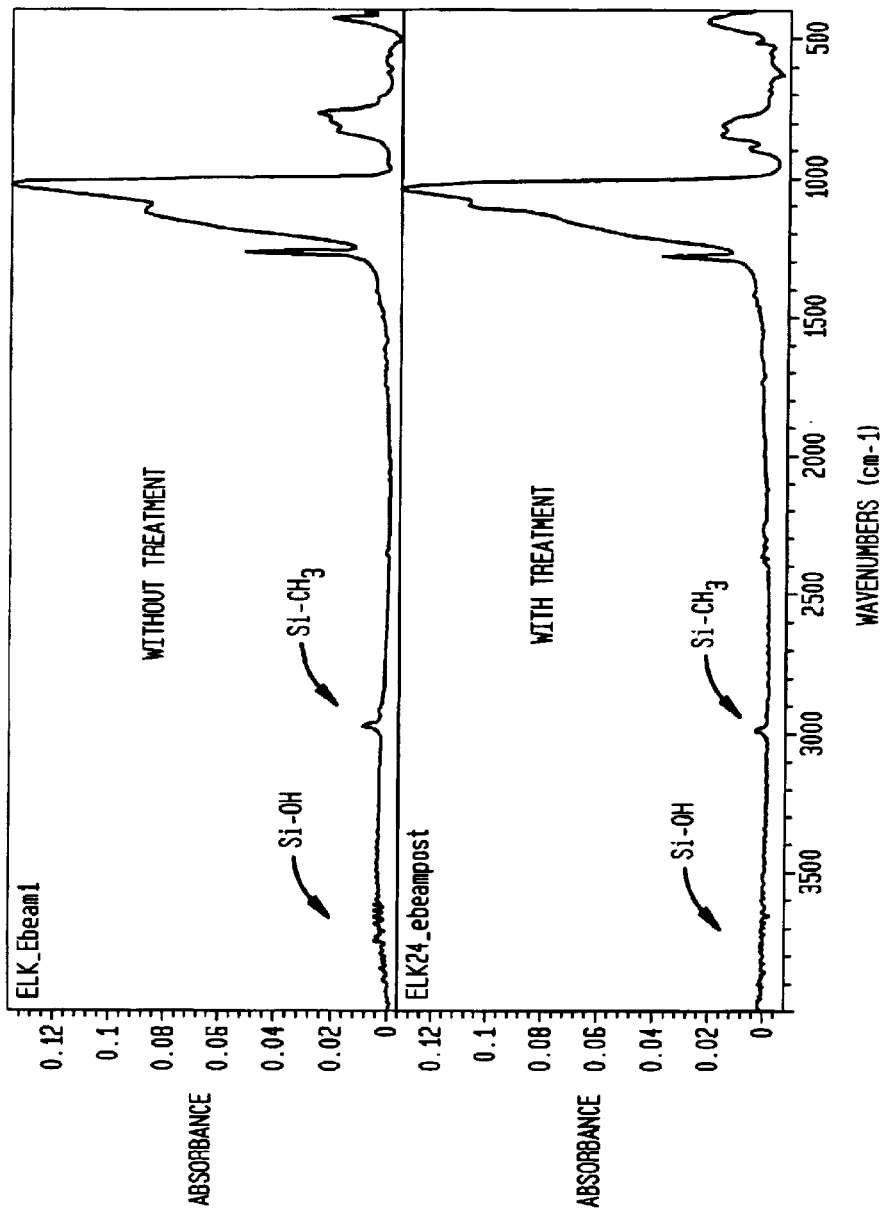
FIG. 7 shows FTIR data for an SOD film before and after e-beam treatment.
Figure 8:
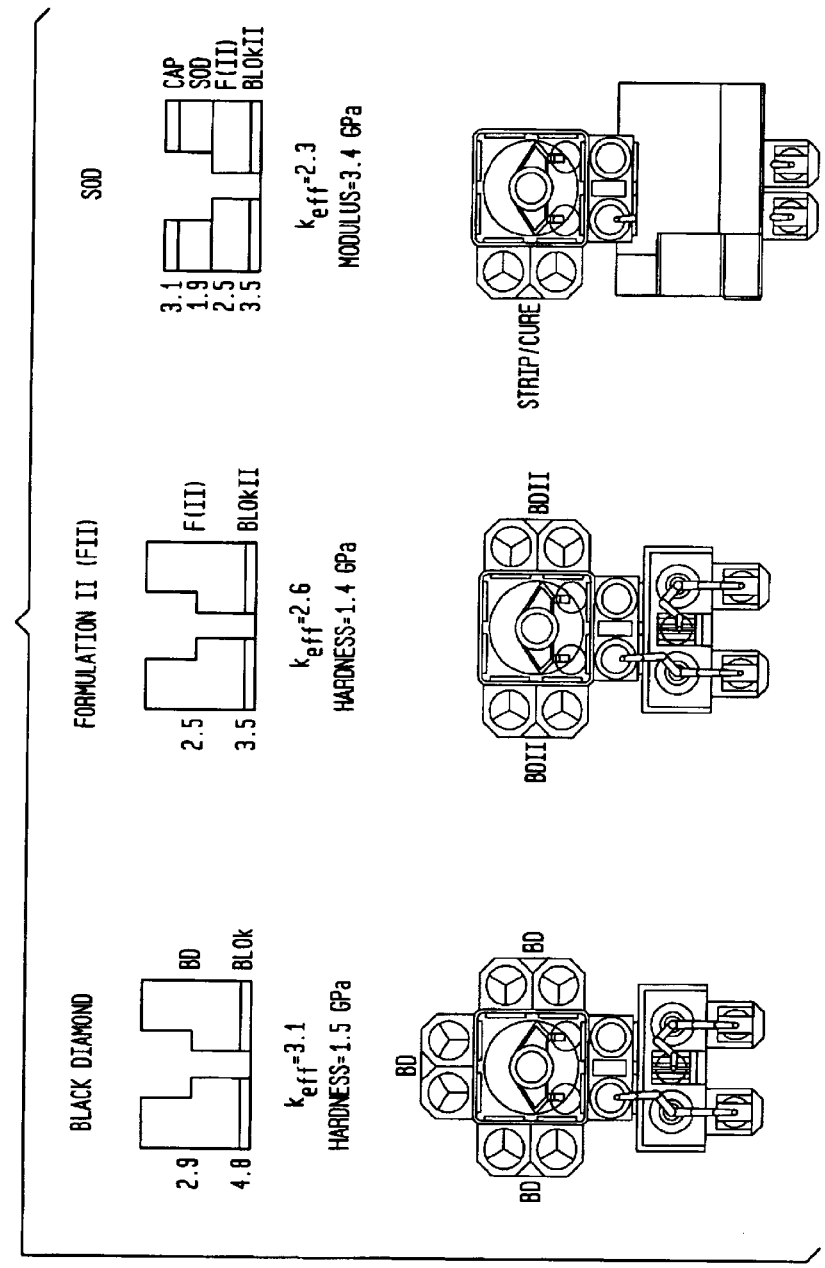
FIG. 8 shows several proposed film products fabricated utilizing films described herein along with proposed equipment platforms for depositing at least some of the films included in such film products.

FIG. 4 illustrates the effect of varying the flow rate of TMS in Examples 1–5 described above. It was found that the dielectric constant significantly decreased as the flow rate of TMS increased between about 200 sccm to about 600 sccm. The low dielectric constants were achieved with a ratio of hydrocarbon compound to acyclic organo-silicon compound of about 15:1 to about 1:1. As illustrated with Example 6 and shown in FIG. 4, the addition of a sufficient amount of the hydrocarbon compound to the cyclic organo-silicon and acyclic organo-silicon compounds provided a dielectric constant at least 7% lower than a dielectric constant obtained by omitting the hydrocarbon compound. Further, the addition of a sufficient amount of the acyclic organo-silicon compound to the cyclic organo-silicon and hydrocarbon compounds provided a dielectric constant about 3% lower than a dielectric constant obtained by omitting the acyclic organo-silicon compound as shown in Example 7.

Then, after the above-described films are deposited, they are e-beam treated using, for example, and without limitation, a chamber like that described above in conjunction with FIG. 1.

Further embodiments of the present invention entail fabricating a lower-k dielectric film referred to herein as formulation-II. This film was fabricated using the chamber described above in conjunction with FIG. 2 wherein the precursors were octamethylcyclotetrasiloxane ("OMCTS:), trimethylsilane (($CH_3$)$_3$—SiH), $O_2$, ethylene ($C_2H_4$), and He as a diluent. In accordance with one such embodiment, the process conditions were: a flow rate for OMCTS of about 5000 mgm; a flow rate for trimethylsilane of about 600 sccm; a flow rate for $O_2$ of about 1000 sccm; a flow rate for ethylene of about 2000 sccm; a flow rate for He of about 1000 sccm; a chamber pressure of about 5.75 Torr; a wafer susceptor temperature of about 400° C.; a wafer to showerhead spacing of about 1050 mils; and an RF power of about 800W. Further useful deposition process conditions can be determined routinely by one of ordinary skill in the art without undue experimentation in light of the detailed description presented herein.

After this film was deposited, it was abeam treated in a chamber like that described above in conjunction with FIG. 1. The process conditions were: a treatment dose of about 100 $\mu C/cm^2$ for about 2 min., a chamber pressure for an ambient gas (Ar) of about 15 mTorr, a voltage of about 4.5 KeV, an electron current of about 3 ma, and a wafer temperature of about 400° C. This resulted in a film whose hardness and Young's modulus improved from about 0.699 GPa and about 4.902 GPa for a control wafer (i.e., no e-beam treatment) to about 1.414 GPa and about 9.563 GPa, respectively, for the e-beam treated wafer, while the dielectric constant remained substantially the same, i.e., a k value of about 2.52 for the control wafer vs. a k value of about 2.49 for the e-beam treated wafer. The thickness changed from a nominal value of about 5000 Å (5292.1 Å) for the control wafer to a thickness of about 4889.3 Å for the e-beam treated wafer. These results are important because they show that the a beam treatment increased the strength of a film which is otherwise mechanically weak, leaving other properties relatively unchanged. A mechanically weak film may be problematic in use in fabricating integrated circuits having many layers such as, for example, logic circuits because stresses which build up due to use of mechanically weak materials may cause stress fractures in upper layers.

In addition to the above-described improvement for e-beam treated formulation-II, the wetting angle decreased for the e-beam treated wafer; showing that the e-beam treated film became hydrophilic. In particular, the wetting angle changed from a value of over about 80° C. for the control wafer to a value of under about 40° C. for the e-beam treated wafer. This is important because many photoresists will not deposit on a hydrophobic surface.

Still further embodiments of the present invention entail fabricating a lower-k dielectric film using an oxidizer (such as, for example, and without limitation, $H_2O_2$, $O_3$, and so forth) and a stable silicon precursor (such as, for example, and without limitation, tri-methyl silane ("TMS") or tetra-methyl silane or a precursor having a built-in metastable functional group, for example, and without limitation, 1,3,5,7-tetramethylcyclotetrasiloxane (TMCTS). The CVD deposition may take place, for example, and without limitation, using the chamber described above in conjunction with FIG. 2 at a relatively low temperature. For example, in accordance with one embodiment of the present invention, a process recipe for one such thermal deposition process using TMS and $O_3$ entails: a chamber pressure of about 100 Torr, a wafer holder temperature of about 100° C., a flow rate for $O_3$ of about 4000 sccm, a flow rate of a diluent such as, for example, and without limitation, He, of about 8000 sccm, and a flow rate of TMS of about 125 seem. Next, the film is e-beam treated (including heating the film at the same time) using, for example, and without limitation, a chamber like that described above in conjunction with FIG. 1.

Processes to Produce Low-k Dielectric Films Using a Chemical Vapor Deposition ("CVD") Step: Approach 2 (Deposit a Film that Includes Unstable Groups, and e-beam Treat it to Eject Metastable Groups, Improve, for Example, its Dielectric Constant, and Mechanical Properties and to Shorten Thermal Anneal Times)

In accordance with one or more embodiments of the present invention, a film is fabricated that includes metastable groups. In accordance with one or more such embodiments, the precursors include vinyl cyclohexane ("VCH"), octamethylcyclotetrasiloxane ("OMCTS"), and He as a diluent, and embodiments of this film were fabricated using the chamber described above in conjunction with FIG. 2. In accordance with one such embodiment, the process conditions were: a flow rate for OMCTS of about 500 mgm, a flow rate for VCH of about 500 mgm, a flow rate for He of about 1000 seem; a chamber pressure of about 5 Torr; a wafer susceptor temperature of about 100° C.; a wafer to showerhead spacing of about 800 mils; and an RF power (13.56 MHz) of about 300 W; and a low frequency power (356 KHz) of about 100 W. The deposition rate for this film was about 12,000 Å/min. Further useful deposition process conditions can be determined routinely by one of ordinary skill in the art without undue experimentation in light of the detailed description presented herein. After this film was deposited it had a refractive index ("RI") equal to about 1.47, and a dielectric constant k equal to about 2.77. The film was thermally annealed for about 30 min. at 440° C. in a furnace. After the thermal anneal, RI was equal to about 1.37, and k was equal to about 2.45.

After this film was annealed, it was e-beam treated in a chamber like that described above in conjunction with FIG. 1. The process conditions were: a treatment dose of about 200 $\mu C/cm^2$ for about 2 min., a chamber pressure for an ambient gas (Ar) of about 15 mTorr, a voltage of about 4 KeV, an electron current of about 3 ma, and a wafer temperature of about 400° C. This resulted in a film having RI equal to about 1.43, k equal to about 2.46, and increased hardness and Young's modulus.

In accordance with this approach, further embodiments include the use of precursors that provide metastable species (for example, and without limitation, cyclohexane or phenyl in the film), and precursors that provide silicon. In accordance with one or more such embodiments, the precursors that provide metastable species include, for example, and without limitation, one or more of norborndiene and butadiene, and the precursors that silicon include, for example, and without limitation, one or more of OMCTS, TMCTS, DMDMOS, and DEMS (Si singly bonded to H, $CH_3$, and $(OC_2H_5)_2$). In accordance with this approach, still further embodiments include the use of precursors where the metastable functional group can be attached to an organic compound, for example, VCH, or it can be built into a silicon precursor, for example, t-butyl TMCTS.

Further embodiments of the present invention with respect to Approach 1 and Approach 2 entail carrying out multiple process step cycles (i.e., thermal deposition/e-beam treatment process step cycles). Finally, and optionally, the resulting film is thermally annealed. In accordance with one such embodiment, the e-beam treatment steps are short to reduce shrinkage and to obtain k values<2.5.

In accordance with another embodiment of the present invention, any of the above-described embodiments may be followed by further treatment processes, prior to and/or after, the optional thermal anneal step, to further harden such organo-silicon-based films. For example, and without limitation, such further treatment processes may include exposure to relatively inert plasmas such as He or $H_2$ plasmas. However, in the absence of penetration throughout the film by higher energy electrons, such effects, for example, hardening, may be linked largely to changes in surface composition induced by sputtering away of organic constituents by ions rather than the cross-linking processes believed to be operative during e-beam treatment. However, for very thin barrier films containing sufficiently high carbon content, the use of such processes can also be advantageous. In accordance with one or more such embodiments, the plasma treatment may be carried out in conventional PECVD or plasma etch hardware.

Processes to Produce Low-k Dielectric Films Using a Spin-On Dielectric ("SOD") Deposition Step E-beam treatment of a lower-k dielectric film such as a spin-on-dielectric ("SOD") film provides a rapid cure process that improves the properties and performance of the film (over those obtained by thermal curing alone). For example, e-beam treatment of a lower-k SOD film provides one or more of: improved mechanical properties (for example, and without limitation, one or more of increased hardness and increased Young's Modulus), lower dielectric constant; dielectric constant stability, improved resistance to wet and dry strip processes; and reduced thermal budgets. In accordance with one or more embodiments of the present invention, the e-beam treatment cures a porous spin-on-dielectric film. It is believed that advantageous effects of this cure are achieved by removing silanol functionality to improve the film's mechanical properties and dielectric stability.

One method of forming a particular type of SOD film is based on a sol-gel process, in which high porosity films are produced by hydrolysis and polycondensation of a silicon alkoxide such as tetraethylorthosilicate (TEOS). The sol-gel process is a versatile solution process for making ceramic material. In general, the sol-gel process involves the transition of a system from a homogeneous liquid "sol" (mostly colloidal) into a solid "gel" phase. The starting materials used in the preparation of the "sol" are usually inorganic salts or compounds such as silicon alkoxides. The precursor solutions are typically deposited on a substrate by spin on methods. In a typical sol-gel process, the precursor is subjected to a series of hydrolysis and polymerization reactions to form a colloidal suspension, or a "sol." Further processing of the "sol" enables one to make ceramic materials in different forms. The further processing may include the thermal decomposition of a thermally labile component, which may include the formation of an ordered surfactant-templated mesostructured film by evaporation-induced self-assembly, followed by the thermal decomposition of the template.

In a particular sol-gel-based process for forming a porous low dielectric constant film, surfactants act as the template for the film's porosity. The porous film is generally formed by the deposition on a substrate of a sol-gel precursor followed by selective evaporation of solvent components of the sol-gel precursor to form supramolecular assemblies. The assemblies are then formed into porous films by the pyrolysis of the supramolecular surfactant templates at a temperature range between approximately 300 and 450° C. This particular sol-gel-based process can produce porous films with controllable pore size and advantageously, with narrow distributions of pore size, which is beneficial for integrated circuit manufacture.

A first step of a basic sol-gel-based process is the synthesis of the stock precursor solution. The stock precursor solution is prepared, for example, by combining a soluble silicon oxide source, e.g., TEOS, water, a solvent, e.g., alcohol, and an acid catalyst, e.g., hydrochloric acid, in particular mole ratios at certain prescribed environmental conditions and mixed for certain time periods.

Once the stock solution is obtained, the coating solution is mixed. A general procedure to prepare the coating solution is to add a surfactant to the stock solution. The surfactants are used as templates for the porous silica. In later processes the surfactants are baked out (i.e., calcined), leaving behind a porous silicon oxide film. Typical surfactants exhibit an amphiphilic nature, meaning that they can be both hydrophilic and hydrophobic at the same time. Amphiphilic surfactants possess a hydrophilic head group or groups which have a strong affinity for water, and a long hydrophobic tail which repels water. The long hydrophobic tail acts as the template member which later provides the pores for the porous film. Amphiphiles can aggregate into supramolecular arrays in solution and in the solidifying gel as the solvent is removed during spin-coating, forming a structure which serves as a template for the porous film. Templating oxides around these arrays leads to materials that exhibit controllable pore sizes and shapes. The surfactants can be anionic, cationic, or nonionic, though for the formation of dielectric layers for IC applications, non-ionic surfactants are generally preferred. The acid catalyst is added to accelerate the condensation reaction of the silica around the supramolecular aggregates.

After the coating solution is mixed, it is deposited on the substrate using a spinning process where centrifugal draining ensures that the substrate is uniformly coated with the coating solution. The coated substrate is then pre-baked to complete the hydrolysis of the TEOS precursor, continue the gelation process, and drive off any remaining solvent from the film.

The pre-baked substrate can then be further baked to form a hard-baked film. The temperature range chosen for the bake step will ensure that excess water is evaporated out of the spin cast film. At this stage the film is comprised of a hard-baked matrix of silica and surfactant with the surfactant possessing an interconnected structure characteristic of the type and amount of surfactant employed. An interconnected structure aids the implementation of the subsequent surfactant extraction phase. An interconnected structure provides continuous pathways for the subsequently ablated surfactant molecules to escape from the porous oxide matrix.

Typical silica-based films often have hydrophilic pore walls and aggressively absorb moisture from the surrounding environment. If water, which has a dielectric constant (k) of about 78, is absorbed into the porous film, then the low k dielectric properties of the film can be detrimentally affected. Often these hydrophilic films are annealed at elevated temperatures to remove moisture and to ablate and extract the surfactant out of the silica-surfactant matrix. Such an anneal step leaves behind a porous film exhibiting interconnected pores. But this is only a temporary solution in a deposition process since the films may still be sensitive to moisture absorption following this procedure.

Some sol-gel processes include further post-deposition treatment steps that are aimed at modifying the surface characteristic of the pores to impart various desired properties, such as hydrophobicity, and increased resistance to certain chemicals. A typical treatment that renders the film more stable is treatment with HMDS (hexamethyldisilizane, $[(CH_3)_3—Si—NH—Si—(CH_3)_3]$), in a dehydroxylating process which will remove the hydroxyl groups, replace them with trimethylsilyl groups, and render the film hydrophobic. Alternatively, or in conjunction with such a silylation step, the porous material may be rendered more hydrophobic by the addition of an alkyl substituted silicon precursor, such as methyl triethoxysilane, $CH_3Si(OCH_2CH_3)_3$, (MTES) to the precursor formulation. It has been found that replacement of a significant fraction of the TEOS with MTES (for example 30–70%) in the liquid precursor formulation generates films exhibiting good resistance to moisture absorption without subsequent exposure to HMDS.

A variety of alternatives to the above-described sol-gel process for depositing SOD films have been proposed. Many of these alternatives follow the same basic general approach discussed above but vary the choice of ingredients used in the coating solution, the processing times and/or temperatures; combine certain steps; and/or divide other steps into various substeps.

In order for the SOD film to be enable successful integration for fabrication, the film must have controlled level of impurities, or it must be deposited using ingredients that have minimal levels of impurities that are harmful in silicon oxide-based insulator films in microelectronic devices. Impurities that are harmful in silicon oxide-based insulator films include alkali ions such as sodium and potassium which transport under the influence of an electric field, and which are non-volatile. These impurities are typically introduced into the film as parts of the surfactants which are used in surfactant templated porous oxide precursor formulations.

While commercially-available unpurified surfactants could be used in chemical formulations to form porous films with desired low dielectric constants, the final films will have impurity levels far in excess of acceptable levels, and thus the surfactant must be purified. Surfactant purification can be performed using common procedures, such as employment of ion exchange columns in which alkali ions can be retained and hydrogen ions released in their place. These unpurified surfactants may commonly possess alkali ion concentrations in the range from about 100 to 1000 parts per million. The goal of surfactant purification is to reduce alkali ion impurity levels to less than 50 parts per billion. Acceptable concentrations of alkali ion impurities in SOD film chemical precursor solutions can be less than 10 parts per billion for each alkali element.

However, it has been discovered that when depositing films from a precursor formulation with a surfactant that was purified (to contain alkali ion impurity levels to less than 50 parts per billion total) to remove undesired alkali metal ion impurities (most notably sodium or potassium ions), the deposited films had relatively high dielectric constants, approaching that of the non-porous dense material. It was also discovered that a purified surfactant could be used to produce porous films with desired low dielectric constants if specific types of ionic or amine additives were added to the formulation in relatively low concentration. These impurities are believed to strengthen the mesophase separation and promote hardening of the pore wall so as to prevent collapse and permit the thermal decomposition and removal of the surfactant to provide the porous film.

Generally, the ionic additive is a compound chosen from a group of cationic additives of the general composition $[NR(CH_3)_3)]^+A^-$, where R is a hydrophobic ligand of chain length 1 to 24, including tetramethylammonium and cetyltrimethylammonium, and $A^-$ is an anion, which may be chosen from the group consisting essentially of formate, nitrate, oxalate, acetate, phosphate, carbonate, and hydroxide and combinations thereof. Tetramethylammonium salts, or more generally tetraalkylammonium salts, or tetraorganoammonium salts or organoamines in acidic media are added to surfactant templated porous oxide precursor formulations to increase the ionic content, replacing alkali ion impurities (sodium and potassium) removed during surfactant purification, but which are found to exhibit beneficial effects towards achieving low dielectric constants.

While the additive may be an ionic additive as is generally described above, the additive may alternately be an amine additive which forms an ionic ammonium type salt in the acidic precursor solution. The suitable amine additive is selected from the group consisting of:

TEDA, triethylenediamine, $(CH_2)_6N_2$;
DELA, diethanolamine, $(HOCH_2CH_2)_2NH$;
TELA, triethanolamine, $(HOCH_2CH_2)_3N$;
APDEA, aminopropyldiethanolamine, $(HOCH_2CH_2)_2N(CH_2CH_2CH_2NH_2)$;
PACM, bis(p-aminocyclohexyl)methane, $NH_2(C_6H_{10})CH_2(C_6H_{10})NH_2$;
QUIN, quinuclidine, $N(CH_2)_6CH$;
3-Quinuclidinol, $N(CH_2)_6CH$;
TMA, trimethylamine, $(CH_3)_3N$;
TMEDA, tetramethylethylendiamine, $(CH_3)_2NCH_2CH_2N(CH_3)_2$;
TMPDA, tetramethyl-1,3-propanediamine, $(CH_3)_2N(CH_2)_3N(CH_3)_2$;
TMAO, trimethylamine oxide, $(CH_3)_3N(O)$;
PC-9,N,N,N-tris(N',N'-dimethyl-3-aminopropyl)amine, $((CH_3)_2NCH_2CH_2CH_2)_3N$;
PC-77,3,3'-bis(dimethylamino)-N-methyldipropylamine, $((CH_3)_2NCH_2CH_2CH_2)_2NCH_3$;
CB, choline hydroxide, $HOCH_2CH_2N(CH_3)_3OH$;
DMAP, 4-dimethylaminopyridine, $(CH_3)2N(C_6H_5N)$;
DPA, diphenylamine, $(C_6H_5N)_2NH$;
TEPA, tetraethylenepentamine, $HN(CH_2CH_2NHCH_2CH_2NH_2)_2$.

As can be recognized, numerous alternate embodiments of the SOD film may be deposited depending upon the choice of the spin-on solution ingredients, in particular, the surfactant and the additive and processing times and parameters. SOD films deposited according to one or more embodiments of the present invention exhibit the following properties:

the film is composed essentially of Si—O and Si—$CH_3$ bonds a dielectric constant in the range between 1.4 and 2.5 a porosity between 20% and 60% a modulus of elasticity of between 1.4 and 10 GPa, and generally between 2 and 6 GPa a hardness value between 0.2 and 2.0 GPa, and generally between 0.4 and 1.2 GPa a refractive index at 633 nm of between 1.1 and 1.5

Additive levels in the final SOD chemical precursor formulation are approximately in the range between 0.1 to 2000 parts per million, and in some embodiments in the range between 1 and 500 parts per million.

As described above, a particular sol-gel-based process as described above may be used to deposit surfactant templated SOD films. As described above, an SOD film is formed by forming a templated sol-gel SOD chemical precursor formulation, spin coating a substrate with the precursor formulation and then thermally treating the coated substrate to form a porous dielectric layer thereon. Specific embodiments of the present invention are directed to the particular method for the formation of the precursor solution composition.

Specifically, the templated sol-gel SOD chemical precursor, according to embodiments of the present invention is formulated by mixing two solutions and then adding the purified surfactant to the mixture of the two solutions, where a first solution is obtained by mixing a soluble silicon oxide source (e.g., TEOS), an alkyl substituted silicon precursor (e.g., MTES) and a solvent, and where a second solution is obtained by mixing water, the acid catalyst and the additive. As described above, the additive is an ionic additive or alternately an amine additive which forms an ionic ammonium type salt in the acidic precursor formulation as described above.

Alternately, the templated sol-gel SOD chemical precursor, according to another embodiment of the present invention is formulated by mixing together two solutions, where a first solution is obtained by mixing a soluble silicon oxide source (e.g., TEOS), an alkyl substituted silicon precursor (e.g., MTES), a solvent and the purified surfactant, and where a second solution is obtained by mixing together water, the acid catalyst and the additive, and further where the additive is an ionic additive or alternately an amine additive which forms an ionic ammonium type salt in the acidic precursor formulation as described above.

Yet, in other alternate precursor formulations, the purified surfactant is added to the solution containing the water, the acid and the additive instead of the silica-containing solution. It is desirable to form two separate solutions where one is the solution containing the solvent, the water, the acid and the additive and the other is the solution containing the silica precursors and the solvent. The surfactant can be added to either of the solutions. Forming the final precursor solution from these two solutions enables the creation of two long-shelf-life solutions, which is commercially advantageous over other highly reactive solutions having a relatively short shelf life. The final precursor solution formed by mixing the two solutions has a much shorter shelf life than the two separate solutions. For example, each of the two separate solutions are chemically stable with a shelf life of over 6 months, while the final precursor formulation which is used to coat substrates may be chemically stable for less than a week. Another advantage of forming a final precursor solution from the two long-shelf life solutions is that it enables the formation of highly reactive mixture before coating the substrates. The highly reactive mixture will allow for a quicker cure of the coated substrates to form a stable film in a reduced time. Thus, a deposition apparatus can be developed to first mix the two long-shelf-life solutions together to form the more reactive formulation mixture to be applied to the wafer. Also note that another method of dealing with these unstable solutions may be to refrigerate them on or the coating platform.

An example of such a deposition apparatus is described in pending U.S. application Ser. No. 09/692,660, assigned to Applied Materials, Inc., and entitled "Ultrasonic Spray Coating of Liquid Precursor for Low K Dielectric Coatings," which is incorporated herein by reference in its entirety. Also, examples of point of use mixing applications are described in pending U.S. application Ser. No. 10/092,980, filed on Mar. 6, 2002, assigned to Applied Materials, Inc., and entitled "Point of Use Mixing and Aging System for Chemicals Used in a Film Forming Apparatus," which is hereby incorporated herein by reference in its entirety.

Embodiments of the present invention are further described by comparing example formulations prepared in accordance with the method of the present invention (Invention Example 1) to two comparative examples. The comparative examples, (i.e., Comparative Examples 1 and 2) describe prior art processes including: a basic precursor solution formulation using industrially available (unpurified) surfactants (i.e., Comparative Example 1); and variant formulations using a purified surfactant (i.e., Comparative Example 2). An example of the invention (i.e., Invention Example 1) describe formulations which has additional amounts of additives added to compensate for the effects of the material impurities removed by purification of the surfactant.

Before describing the purified formulation (Comparative Example 2) or formulations having additives (Invention Example 1), an example of a precursor formulation using an unpurified surfactant is described below (Comparative Example 1). This example (Comparative Example 1) serves as a foundation for the remaining examples.

COMPARATIVE EXAMPLE 1

Precursor Formulation Using an Unpurified Surfactant.

This example describes a process for preparing a precursor formulation using an unpurified surfactant to form a porous oxide-based film. Using this formulation, an SOD film was deposited according to a sol-gel-based process as described above. A precursor solution containing at least a silica precursor composed primarily of a silicon/oxygen compound, water, a solvent, a surfactant and a catalyst was formed. The precursor solution was spun on the wafer and the wafer thermally treated by being baked in a chamber at various temperatures between about 90° C. and 450° C. for between about 30 and 3600 seconds in inert or oxidizing environments having pressures in the range from about 0.1 Torr to atmospheric. The silicon/oxygen compounds were selected from the group consisting of tetraethylorthosilicate, tetramethoxysilane, phenyltriethoxysilane, methyltriethoxysilane, 1,1,3,3-tetraethoxy-1,3-dimethyldisiloxane, and combinations thereof. The solvent was selected from the group consisting of ethanol, isopropanol, propylene glycol monopropyl ether, n-propanol, n-butanol, t-butanol, ethylene glycol and combinations thereof. The catalysts were selected from the group consisting of acetic acid, formic acid, glycolic acid, glyoxylic acid, oxalic acid and nitric acid. The surfactant was a non-ionic surfactant selected for example from the group consisting of polyoxyethylene oxides-polypropylene oxides-polyethylene oxides triblock copolymers (such as the Pluronics line of surfactants marketed by BASF), the Brij line marketed by ICI such as octaethylene glycol monodecyl ether and octaethylene glycol monohexadecyl ether), and the Triton™ line marked by Union Carbide (now Dow Chemical) such as Triton™ 114, Triton™ 100, Triton™ 45, and related compounds and combinations thereof. The particular unpurified surfactant used was from the Triton™ series offered by Union Carbide (now Dow Chemical) and more specifically the Triton™ X-114 surfactant, which is an octylphenol ethoxylate-type surfactant. The use of the X-114 surfactant results in films having smaller and more uniform pore sizes, than other non-Triton surfactants listed.

In particular, the specific precursor formulation used in this example (Comparative Example 1) had the following composition: tetraethoxysilane (TEOS)—22.5 gms; methyltriethoxysilane (MTES)—22.5 gms; propylene glycol monopropyl ether (PGPE)—46.72 gms; 0.1N Nitric acid—24 gms; and Triton X-114—9.67 gms (Triton 114 is trademark of a mixture of ethoxylated p-tert-octylphenols manufactured by the Union Carbide Corporation).

Silicon oxide-based films were deposited using the commercially available nonionic surfactants which contain alkali metal impurities. Alkali metal impurities are commonly present in commercial surfactants in the range between about 100 to 1000 parts per million. While these films possessed the necessary requirements for microelectronic devices including very low dielectric constants (less than 2.5), good adhesion, high modulus of elasticity, and small pores sizes, the presence of unacceptable levels of alkali metal and alkali ion impurities contained within the surfactant, rendered these silicon oxide-based films unacceptable for microelectronic applications. As described above, acceptable levels of alkali metal impurity concentrations in SOD film chemical precursor solutions are less than 20 parts per billion for each type of alkali metal, and preferably less than 10 parts per billion for each alkali element.

Therefore, it was intended to develop a formulation which could be used to form SOD films having minimal levels of impurities by using an improved surfactant in the precursor formulation. An improved surfactant for this formulation is readily purifiable by distillation, ion exchange chromatography, or ideally can be prepared without the use of problematic impurities such as alkali metal compounds.

COMPARATIVE EXAMPLE 2

Precursor Formulation Using a Purified Surfactant.

This example describes a process for the formation of precursor formulation using a purified surfactant to deposit a film. The difference between the formulation of this example (Comparative Example 2) and the specific formulation of the previous example (Comparative Example 1) is that the formulation in this example uses a purified form of the Triton™ surfactant, i.e., one where the alkali metal impurities were removed from the surfactant before it was added to the coating solution. Alkali metal impurities in the purified surfactant were approximately less than 50 parts per billion. Surfactant purification can be performed using common procedures, such as employment of ion exchange columns in which alkali ions can be retained and hydrogen ions released in their place. Using this formulation, an SOD film was deposited based on a sol-gel process as described above by steps 100–150.

However, once the films were deposited using the purified surfactants, it was discovered in that the pores were not formed in the films and hence the films collapsed to a thickness much lower than that expected and the films' dielectric constant increased to values higher than 3.0. The increase in the dielectric constant is believed to be at least due to the loss of porosity in the film. Thus it was discovered that the absence of the alkali metal ion impurities present in commercial impacts the properties of the final film using such a purified formulation.

INVENTION EXAMPLE 1

Precursor Formulation Using a Purified Surfactant and Additives and Effects of Additives.

This example describes specific formulations for depositing porous silicon oxide-based films using a sol-gel-based process utilizing a precursor solution formulation which includes a purified nonionic surfactant and an ionic additive in accordance with embodiments of the present invention. Alkali metal impurities in the purified surfactant were approximately less than 50 parts per billion. The difference between the formulation of this example (Invention Example 1) and the formulation of the previous example (Comparative Example 2) is the addition of the additive to the precursor formulation as is described below. Using this precursor solution formulation the deposited films' properties meet the requirements of having a dielectric constant less than or equal to 2.5, and high porosity, while containing minimal levels of alkali metal impurities.

In particular formulations, tetramethylammonium salts including tetramethylammonium formate, tetramethylammonium nitrate, tetramethylammonium oxalate, tetramethyl ammonium hydroxide and tetramethylammonium acetate were added to the precursor formulation. The precursor solution was then formulated by adding the additive to a first solution containing the water and the acid and adding this first solution to a second solution containing the TEOS, the MTES, the solvent and the surfactant. It is believed that the volatilization of acid components during subsequent thermal processing may have shifted the effective pH in the film from acid to neutral or basic, thus promoting the condensation of the sol-gel network (precursor to the pore walls) around the surfactant, although other mechanisms are not ruled out. Three specific types of films were prepared using three specific additive-enhanced formulations. These three film types were formed on wafers 2–7 as shown on Table 1 below. The amounts and type of additives for the three formulations are shown below in Table 1. The surfactant used for all cases shown in Table 1 is a the Triton™ 114 surfactant purified to remove alkali metal ion impurities.

TABLE SOD-1

| Wafer No. | Solution Used | Additive | Thickness - Å | K |
|---|---|---|---|---|
| 1. | Purified 114 | None | 4055 | 3.30 |
| 2. | Purified 114 | 0.25 g of 25% of tetramethyl ammonium formate | 5903 | 2.12 |
| 3. | Purified 114 | 0.05 g of 25% of tetramethyl ammonium nitrate | 5907 | 2.14 |
| 4. | Purified 114 | 700 ppm tetramethyl ammonium hydroxide (TMAH) | 4630 | 2.26 |
| 5. | Purified 114 | 100 ppm TMAH | 6480 | 2.28 |
| 6. | Purified 114 | 30 ppm TMAH | 6268 | 2.27 |
| 7. | Purified 114 | 15 ppm TMAH | 6409 | 2.24 |

Table SOD-1 provides the dielectric constant data of films deposited from various precursor formulations shown in Table SOD-1. The formulation used to deposit the oxide-based film on wafer 1 used no added salt. Wafer 1 has a deposited film thickness of 4055 Å and a dielectric constant of 3.3. By the addition of 0.25 g of tetramethylammonium formate to the precursor solution, the results shown for wafer 2 were obtained, which had a deposited film thickness of 5903 Å and a dielectric constant of 2.12. Similar results were obtained with the addition of 0.05 g of tetramethylammonium nitrate to the precursor solution before depositing the film on wafer 3. The increased film thickness was due to increased pore formation in the film with the addition of the salt additive.

The formulation used to form a porous oxide film on wafers 4, 5, 6 and 7 used a 2.4 wt. % solution of tetramethylammonium hydroxide (TMAH) solution as an additive. The quantity of the additive added to the solution ranged from 700 ppm to 15 ppm relative to the precursor formulation. As can be seen from the results in Table SOD-1, TMAH also results in the formation of thicker films as compared to the films formed using a purified surfactant where no additive was present in the formulation. The results for TMAH addition show that, in general, an increase in the quantity of the added TMAH results in an increase in film thickness, and a reduction in the dielectric constant of the film as compared to films deposited using additive-free formulations. These results confirm the utility of this approach for restoration of the desired film properties for IMD or other electronic applications.

It is believed that the above-described results may be due to the fact that the salts play a similar role as the removed alkali metals in promoting sol condensation, and in stabilizing the mesophase structure prior to and during thermal processing steps. Moreover, these results may be also due to the improved atomic level interactions between the surfactant molecules and silica species. As is known, formation of surfactant templated thin films is based on co-assembly of silica and surfactant by means of electrostatic or hydrogen bonding interactions. In alternative embodiments of a method of forming a precursor solution for depositing a porous oxide film according to the present invention, the ionic additives could be added to either the stock or the coating precursor solution.

The film may also be cured by exposing the surface of the substrate to a flux of electrons. Such a treatment is performed by placing the substrate inside the chamber described above in conjunction with FIG. 1, and also such as that described in U.S. Pat. No. 5,003,178, the disclosure of which is incorporated herein by reference.

Example 1: An SOD film was fabricated using the following formulation (weight in grams): TEOS (22.5); MTES (22.5); PGPE (160); L101 (12.5) [L101 is a surfactant supplied by BASF which is a co-polymer of the form $(PEO)_n$-$(PPO)_n$-$(PEO)_n$]; water (20.67); 0.1 $HNO_3$ (20.67); TMAH 2.4% (1.67). The process included the following steps: (a) spin-on at 2000 rpm; (b) bake at 90° C. for 90 sec; (c) bake at 140° C. for 90 sec; and (d) thermal cure at 400° C. for 3 min in an $N_2$ (with 2% oxygen added) at 550 Torr.

The following shows the effects of e-beam treatment on the SOD films produced in Example 1 above for an exposure of about 2 minutes, a chamber pressure for an ambient gas (Ar) of about 15 mTorr, and a wafer temperature of about 400° C.

EXAMPLE 1

| voltage dose ($\mu C/cm^2$) | no e-beam | 3 kev 90 $\mu C/cm^2$ | 3 kev 60 $\mu C/cm^2$ | 4 kev 90 $\mu C/cm^2$ | 4 kev 60 $\mu C/cm^2$ |
|---|---|---|---|---|---|
| K value | 1.97 | 1.91 | 1.9 | 1.92 | 1.89 |
| K stability % | 6.0% | 3.9% | 3.2% | 3.8% | 3.0% |
| Modulus (GPa) | 2.17 | 3.35 | 3.1 | 3.82 | 3.28 |
| Hardness (GPa) | 0.27 | 0.37 | 0.35 | 0.41 | 0.37 |
| Refractive Index-RI | 1.184 | 1.178 | 1.178 | 1.176 | 1.177 |
| Thickness (Å) | 3320 | 3077 | 3122 | 3054 | 3111 |
| Shrinkage % |  | 7.5 | 5.4 | 8.1 | 6.4 |

Example 2: An SOD film was fabricated using the following formulation (weight in grams): TEOS (22.5); MTES (22.5); PGPE (195.8); T 114 (16.1) [T114 is a surfactant supplied by Union Carbide, now Dow Chemical having the structure

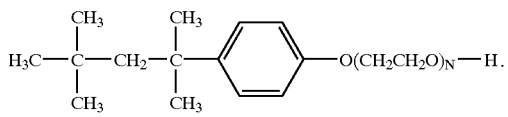

where N=7 to 8]; water (20.67); 0.1 $HNO_3$ (20.67); TMAH 2.4% (1.67). The process included the following steps: (a) spin-on at 2000 rpm; (b) bake at 90° C. for 90 sec; (c) bake at 140° C. for 90 sec; and (d) thermal cure at 400° C. for 3 min in an $N_2$ (with 2% oxygen added) at 550 Torr.

The following shows the effects of e-beam treatment on the SOD films produced in Example 2 above for an exposure of about 2 minutes, a chamber pressure for an ambient gas (Ar) of about 15 mTorr, and a wafer temperature of about 400° C.

EXAMPLE 2

| voltage dose ($\mu C/cm^2$) | no e-beam | 3 kev 90 $\mu C/cm^2$ | 3 kev 60 $\mu C/cm^2$ | 4 kev 90 $\mu C/cm^2$ | 4 kev 60 $\mu C/cm^2$ |
|---|---|---|---|---|---|
| K value | 1.95 | 1.9 | 1.87 | 1.89 | 1.87 |
| K stability % | 6.2% | 3.9% | 3.2% | 3.8% | 3.9% |
| Modulus (GPa) | 1.88 | 3.26 | 2.95 | 3.4 | 3.3 |
| Hardness (GPa) | 0.21 | 0.35 | 0.32 | 0.38 | 0.34 |
| Refractive Index-RI | 1.178 | 1.173 | 1.173 | 1.176 | 1.175 |
| Thickness (Å) | 3304 | 2984 | 3051 | 2944 | 3024 |
| Shrinkage % |  | 10.0 | 8.0 | 11.0 | 9.0 |

It should be understood that embodiments of the present invention are not limited to use of the above-described SOD films, and that further embodiments of the present invention exist wherein e-beam treatment is provided of other porous SOD films. In accordance with some of such further embodiments, e-beam treatment is carried out on a porous film where the properties of the abeam treatment (for example, current, voltage, and so forth) are such that Si that is bonded to a terminal group in the film (for example, Si—OH or Si—$CH_3$) is converted to Si that is involved in cross-linking bonds (for example, Si—O—Si or Si—$CH_2$—Si). It is believed that subsequent cross-linking of such bonds provides improved properties, for example, mechanical properties of the SOD film. For example, it is believed that Si—OH bonds cause dielectric constant instability by enabling water absorption, whereas, Si—$CH_2$—Si bonds cause dielectric stability by preventing water absorption.

Another example of a process for producing an improved SOD film comprises e-beam treating a porous SOD film comprising at least one siloxane compound to convert the film into a film having silicon carbide bonds represented by Si—C—Si. Such processes further include processes wherein the siloxane compound is a product of the hydrolysis and/or condensation of at least one compound selected from the group consisting of compounds represented by the following formula (1):

$$R^1_a Si(OR^2)_{4-a} \tag{1}$$

wherein $R^1$ represents a monovalent organic group or a hydrogen atom; $R^2$ represents a monovalent organic group; and a is an integer of 0 to 2, and compounds represented by the following formula (2):

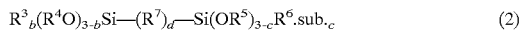

$$R^3_b(R^4O)_{3-b}Si-(R^7)_d-Si(OR^5)_{3-c}R^6_c \tag{2}$$

wherein $R^3$, $R^4$, $R^5$, and $R^6$ may be the same or different and each represents a monovalent organic group; b and c may be the same or different and each is an integer of 0 to 2; $R^7$ represents an oxygen atom or a group represented by —$(CH_2)_n$—, wherein n is 1 to 6; and d is 0 or 1.

In accordance with one or more of such embodiments, In accordance with one or more such embodiments, the film comprising a siloxane compound is heat-cured at a temperature in a range of from about 300 to about 500° C. before being subjected to an e-beam treatment. The e-beam treatment is conducted at an energy in a range of from about 0.1 to about 50 KeV at a dose in a range of from about 1 to about 1,000 $\mu C/cm^2$, at a wafer temperature in a range of from about 25 to about 500° C. The time required for treating the SOD film is generally in a range of from about 15 seconds to about 5 minutes of exposure. Also multistep processes can be used by varying the voltage and dose to treat different regions of the film. For example, step 1 may utilize 4 kev, 90 $\mu$C/cm$^2$; step 2 may utilize 3 kev, 45 $\mu$C/cm$^2$; and step 3 may utilize 2 kev, 30 $\mu$C/cm$^2$.

In forming the coating film, a coating composition prepared by dissolving at least one siloxane compound in an organic solvent (the "coating composition") is applied to a substrate, and the organic solvent is removed from the coating. Ingredient (A) which is the siloxane compound is a product of the hydrolysis and/or condensation of at least one compound selected from the group consisting of compounds represented by formula (1) above, and compounds represented by formula (2) above. The term "product of complete hydrolysis and condensation" means a product in which all the R$^2$O—, R$^4$O—, and R$^5$O— groups in compounds (1) and (2) have been hydrolyzed into SiOH groups and completely condensed to form a siloxane structure. Compounds (1) and (2) are hydrolyzed and condensed in an organic solvent. A catalyst is generally used for the hydrolysis and condensation of compounds (1) and (2) in an organic solvent. Examples of the catalyst include organic acids, inorganic acids, organic bases, inorganic bases, and metal chelates. The coating composition for use in the invention can be produced by mixing the siloxane compound with an organic solvent together with other ingredients according to need. The coating composition for use in carrying out one or more embodiments of the present invention may further contain ingredients such as a colloidal silica, colloidal alumina, and surfactant. Usable coating techniques include spin coating, dip coating, roll coating, and spraying. The disclosure of U.S. patent application Publication Pub. No.: US 2001/0018129 A1 published Aug. 30, 2001 is hereby incorporated herein by reference in its entirety.

Process to Produce Improved Amorphous Carbon-Based Films

One or more embodiments of the present invention includes methods for forming and e-beam treating an amorphous carbon layer for use in integrated circuit fabrication. In accordance with one such embodiment of the present invention, in a first step of a method of producing an improved amorphous carbon-based film, an amorphous carbon-based film is deposited in a CVD deposition chamber like that described above in conjunction with FIG. 2. The amorphous carbon layer may be formed by thermally decomposing a gas mixture comprising a hydrocarbon compound and an inert gas. The gas mixture, which may optionally include an additive gas, is introduced into the CVD deposition chamber where plasma enhanced thermal decomposition of the hydrocarbon compound, for example, and without limitation, in close proximity to a substrate surface, results in deposition of an amorphous carbon layer on the substrate surface. An as-deposited amorphous carbon layer, deposited according to the process of the invention, has an adjustable carbon:hydrogen ratio that ranges from about 10% hydrogen to about 60% hydrogen. The amorphous carbon layer also has a light absorption coefficient, k, that can be varied between about 0.1 to about 1.0 at wavelengths below about 250 nm, making it suitable for use as an anti-reflective coating (ARC) at DUV wavelengths. In a second step of the method of producing an improved amorphous carbon-based film, the CVD deposited film is e-beam treated in a chamber like that described above in conjunction with FIG. 1.

In accordance with one integrated circuit fabrication process, the improved amorphous carbon layer is used as a hardmask. For such an embodiment, a process sequence includes depositing an amorphous carbon layer on a substrate, and e-beam treating it. After the amorphous carbon layer is deposited on the substrate and e-beam treated, an intermediate layer is formed thereon. A pattern is defined in the intermediate layer and transferred into the improved amorphous carbon layer. Thereafter, the pattern is transferred into the substrate using the improved amorphous carbon layer as a hardmask. Additionally, the pattern defined in the improved amorphous carbon hardmask can be incorporated into the structure of the integrated circuit, such as for example in a damascene structure. Note that the abeam treated, improved hardmask is more dense, and yields higher etch selectivity and better profile control.

In accordance with another integrated circuit fabrication process, the improved amorphous carbon layer is used as a single layer anti-reflective coating for DUV lithography. For such an embodiment, a process sequence includes forming the improved amorphous carbon layer on a substrate, i.e., by CVD deposition of an amorphous carbon layer and e-beam treating it. The improved amorphous carbon layer has a refractive index (n) in the range of about 1.5 to 1.9 and an absorption coefficient (k) in the range of about 0.1 to about 1.0 at wavelengths less than about 250 nm. The refractive index (n) and absorption coefficient (k) for the improved amorphous carbon ARC are tunable, in that they can be varied in the desired range as a function of the temperature and composition of the gas mixture during layer formation. After the improved amorphous carbon layer is formed on the substrate, a layer of energy sensitive resist material is formed thereon. A pattern is defined in the energy sensitive resist at a wavelength less than about 250 nm. Thereafter, the pattern defined in the energy sensitive resist is transferred into the improved amorphous carbon layer. After the improved amorphous carbon layer is patterned, such pattern is optionally transferred into the substrate.

In accordance with still another integrated circuit fabrication process, a multi-layer improved amorphous carbon anti-reflective coating is used for DUV lithography. For such an embodiment a process sequence includes forming a first amorphous carbon layer on a substrate, and e-beam treating it. The first amorphous carbon layer has an index of refraction in the range of about 1.5 to about 1.9 and an absorption coefficient (k) in the range of about 0.5 to about 1.0 at wavelengths less than about 250 nm. After the first improved amorphous carbon layer is formed on the substrate, a second improved amorphous carbon layer is formed thereon. The second improved amorphous carbon layer has an index of refraction of about 1.5 to about 1.9, and an absorption coefficient in the range of about 0.1 to about 0.5. The refractive index (n) and absorption coefficient (k) for the first and second improved amorphous carbon layers are tunable, in that they can be varied in the desired range as a function of the temperature and composition of the gas mixture during layer formation. A layer of energy sensitive resist material is formed on the second improved amorphous carbon layer. A pattern is defined in the energy sensitive resist layer at a wavelength less than about 250 nm. The pattern defined in the energy sensitive resist material is thereafter transferred into the second improved amorphous carbon layer followed by the first improved amorphous carbon layer. After the first improved amorphous carbon layer is patterned, such pattern is optionally transferred into the substrate.

In accordance with one or embodiments of the present embodiment, amorphous carbon layer deposition is accomplished by plasma enhanced thermal decomposition of a hydrocarbon compound such as propylene ($CH_6$) in a chamber like that described above in conjunction with FIG. 2.

In accordance with one embodiment of the present invention the amorphous carbon layer is formed from a gas mixture of a hydrocarbon compound and an inert gas such as argon (Ar) or helium (He). The hydrocarbon compound has a general formula $C_xH_y$, where x has a range of between 2 and 4 and y has a range of between 2 and 10. For example, propylene ($C_3H_6$), propyne ($C_3H_4$), propane ($C_3H_8$), butane ($C_4H_{10}$), butylene ($C_4H_8$), butadiene ($C_4H_6$), or acetelyne ($C_2H_2$) as well as combinations thereof, may be used as the hydrocarbon compound. Similarly, a variety of gases such as hydrogen ($H_2$), nitrogen ($N_2$), ammonia ($NH_3$), or combinations thereof, among others, may be added to the gas mixture, if desired. Ar, He, and $N_2$ are used to control the density and deposition rate of the amorphous carbon layer. The addition of $H_2$ and/or $NH_3$ can be used to control the hydrogen ratio of the amorphous carbon layer.

In general, the following deposition process parameters can be used to form the amorphous carbon layer. The process parameters range from a wafer holder temperature in a range of about 100° C. to about 500° C., a chamber pressure in a range of about 1 Torr to about 20 Torr, a hydrocarbon gas ($C_xH_y$) flow rate in a range of about 50 sccm to about 500 sccm (per 8 inch wafer), an RF power in a range of between about 3 W/in$^2$ to about 20 W/in$^2$, and a spacing between the wafer and the showerhead in a range of between about 300 mils to about 600 mils. The above process parameters provide a typical deposition rate for the amorphous carbon layer in the range of about 100 Å/min to about 1000 Å/min and can be implemented on a 200 mm substrate in a deposition chamber available from Applied Materials, Inc. Other deposition chambers are within the scope of the invention and the parameters listed above may vary according to the particular deposition chamber used to form the amorphous carbon layer. For example, other deposition chambers may have a larger or smaller volume, requiring gas flow rates that are larger or smaller than those recited for deposition chambers available from Applied Materials, Inc.

The as-deposited amorphous carbon layer has an adjustable carbon:hydrogen ratio that ranges from about 10% hydrogen to about 60% hydrogen. Controlling the hydrogen ratio of the amorphous carbon layer is desirable for tuning its optical properties as well as its etch selectivity. Specifically, as the hydrogen ratio decreases the optical properties of the as-deposited layer such as for example, the index of refraction (n) and the absorption coefficient (k) increase. Similarly, as the hydrogen ratio decreases the etch resistance of the amorphous carbon layer increases. The light absorption coefficient, k, of the amorphous carbon layer can be varied between about 0.1 to about 1.0 at wavelengths below about 250 nm, making it suitable for use as an anti-reflective coating (ARC) at DUV wavelengths. The absorption coefficient of the amorphous carbon layer can be varied as a function of the deposition temperature. In particular, as the temperature increases the absorption coefficient of the as deposited layer likewise increases. For example, when propylene is the hydrocarbon compound the k value for the as-deposited amorphous carbon layers can be increased from about 0.2 to about 0.7 by increasing the deposition temperature from about 150° C. to about 480° C. The absorption coefficient of the amorphous carbon layer can also be varied as a function of the additive used in the gas mixture. In particular, the presence of $H_2$, $NH_3$, $N_2$ or combinations thereof, in the gas mixture can increase the k value by about 10% to about 100%.

The improved amorphous carbon layer may be stripped from a dielectric layer by etching it in an ozone, oxygen or ammonia plasma.

In accordance with one embodiment of the present invention, a precursor for amorphous carbon layer deposition can be a gaseous hydrocarbon such as, for example, and without limitation, methane, propylene or a liquid aromatic precursor such as, for example, and without limitation, toluene. The above-described deposition processes can be used to deposit the film so it has either tensile or compressive stress (compressive stress in an as deposited film may be advantageous since it is believed that a subsequent e-beam treatment will make the film more tensile). The as-deposited, amorphous carbon layer film can be made more compressive by inducing high ion energy bombardment, and doping of the film with nitrogen (as well as the use of high helium flows) during deposition. Next, in accordance with this embodiment of the present invention, in a second step of the method of producing an improved amorphous carbon layer film, an e-beam treatment is carried out. Finally, in accordance with this embodiment of the present invention, in an optional third step of the method of producing an improved amorphous carbon layer film, the e-beam treated amorphous carbon layer film is thermally annealed Advantageously, in accordance with the above-described embodiments of the present invention, e-beam treatment of the CVD deposited amorphous carbon layer film may produce sufficient densification that the amorphous carbon layer film may be produced in a process wherein CVD deposition of the amorphous carbon layer film can take place at a relatively low temperature (i.e., a deposition temperature less than about 400° C.). Advantageously, such low deposition temperatures make this process compatible with back-end deposition applications such as Cu damascene processes, and deposition over aluminum layers.

Processes to Utilize E-Beam Treated Films
Utilize an E-Beam Treated Film in a Copper Damascene Application E-Beam Treat Etched Sidewalls of Low-k Dielectric Films A typical process flow for a copper damascene application involves an etching process to form a trench or a via in a low-k dielectric film (for example, CVD-deposited or SOD, including porous and non-porous, films), a physical vapor deposition ("PVD") process to form a thin adhesion-diffusion barrier layer (comprised, for example, of thin Ta/TaN layers) on the low-k dielectric film, a deposition process to form a copper seed layer on the barrier layer, and an electroplating process to fill the trench or via with copper. Because line widths are becoming narrower, the PVD barrier layer needs to be as thin as possible, and is typically less than 50 angstroms thick on sidewalls of the trench or via. However, the trench or via sidewalls must be covered by the PVD barrier layer, among other things, to prevent an electroplating solution from the copper electroplating step from penetrating into the low-k dielectric film—which film is typically porous. Thus, the porosity of low-k dielectric films becomes an integration issue for PVD barrier layer deposition.

Another integration issue arises with respect to PVD barrier layer deposition because a typical PVD process involves a proclean step wherein a low pressure plasma is used to clean and prepare a porous low-k dielectric film for subsequent deposition of the barrier layer (one purpose of the pre-clean step is to promote better adhesion of the barrier layer). However, in accordance with the prior art, the pre-clean step is essentially a low pressure sputter etch step using argon that can damage the porous low-k dielectric film (this damage is usually seen as an increase in the k value of the low-k dielectric film, or as a change in the surface composition of the low-k dielectric film). Although a PVD process is currently used in the industry to deposit the barrier layer, in the future, CVD processes will become more common. In fact, a CVD barrier layer can be, for example, and without limitation, a TiN film or a TiSiN film, and since CVD barrier layers may be thinner than their PVD barrier layer counterparts, the diffusion issued raised by porous low-k dielectric films with respect to PVD barrier layers may become an even larger issue for porous low-k dielectric films with respect to CVD barrier layers. In addition to he above, as linewidths become even narrower, it is expected that atomic layer deposition ("ALD") processes will also become commonly used to deposit, among other things, barrier layers. As one of ordinary skill in the art can readily appreciate from this, diffusion issues raised by porous low-k dielectric films with respect to CVD barrier layers will also arise for porous low-k films with respect to ALD barrier layers.

In accordance with one or more embodiments of the present invention, porous low-k dielectric etched sidewalls of trenches or vias are e-beam treated prior to barrier deposition (for example, PVD or CVD barrier layer deposition) to modify and/or harden the sidewalls of the porous low-k dielectric to: (a) improve barrier layer adhesion; and (b) prevent copper diffusion into the porous low-k dielectric film. It should also be understood that such embodiments are not limited to use with porous low-k dielectric films is ideally porous, and that such embodiments can also be used with CVD low-k films in general to promote better sidewall adhesion of barrier layers. Advantageously, in accordance with such embodiments, it is believed that the e-beam treatment promotes cross-linking in the films to provide improved mechanical properties without changing their dielectric constant. In accordance with any of these embodiments, subsequent barrier layer deposition processes can be either PVD or CVD processes.

One or more of the above-described embodiments may be used, for example, and without limitation, with: (a) porous dielectric organic films such as, for example, and without limitation, SiLK (for example, porous SiLK films have pore sizes larger than about 60 to 80 Å); (b) organo-silicon-based films (deposited either by CVD or spin-on processes) such as, for example, and without limitation, carbon doped oxide films (typical organo-silicon-based films have dielectric constants of 2.2 or below, pore sizes of 25 angstroms or less, porosities in a range from about 50% to about 60%); and (c) CVD films such as Black Diamond™, carbon doped oxide films, and so forth.

In accordance with one embodiment of the present invention, to perform the e-beam treatment, a wafer is tilted and rotated under a blanket abeam source such as that described above in conjunction with FIG. 1 to provide efficient abeam exposure of trench or via sidewalls. By keeping the wafer on a stage that tilts directionally towards the e-beam source, due to the isotropic nature of the electron flux, the sidewalls are uniformly treated. Lower pressures used in the e-beam chamber (for example, and without limitation, about 15 mT) may make the electron flux more isotropic. The tilt angle may be varied during treatment to be able to treat sidewalls of trenches or vias having different aspect ratios. In accordance with a further such embodiment, a magnetic field produced by coils surrounding treatment chamber 100 in FIG. 1 is dithered to provide more uniform coverage of electrons hitting the sidewalls to be treated. In accordance with further embodiments, higher e-beam treatment chamber pressures (for example, including pressure up to about 70 mT) can be used to increase the anisotropy of the e-beam.

In accordance with one such embodiment, an e-beam treatment would entail a blanket e-beam treatment. In addition, in accordance with one such embodiment, a blanket e-beam treatment chamber (such as, for example, and without limitation, treatment chamber 100 described above in conjunction with FIG. 1) would reside on a barrier-seed (adhesion layer/barrier layer/copper seed layer deposition) platform having continuous vacuum (for example, and without limitation an Endura platform available from Applied Materials, Inc. of Santa Clara, Calif.), thereby producing better barrier layer adhesion on the etched low-k dielectric film, and avoiding contamination that might result from transferring wafers between platforms. Advantageously, in accordance with one or more further embodiments of the present invention, the e-beam treatment step may reduce, or replace, the use prior art pre-clean processes described above (i.e., sputter processes) that might damage porous films. Advantageously, the e-beam treatment may: (a) make the etched sidewalls of the low-k dielectric film denser and harder; and (b) help to reduce open pores on the etched sidewalls (large open pores on the etched sidewalls are not desirable since they make good barrier layer coverage difficult). In accordance with one or more of the above described embodiments of the present invention, the electron energy of the e-beam is tuned to minimize damage on the sidewalls.

In accordance with one such embodiment of the present invention, a gas in the e-beam treatment chamber is argon. In accordance with a further embodiment of the present invention, a multi-step e-beam treatment comprises a first step using $H_2$ in the e-beam chamber, and a second step using argon (Ar) in the e-beam chamber. It is believed that the use of H2 is advantageous in that it may passivate the porous low-k dielectric film, and it may also remove residual fluorine in the etched sidewalls—which fluorine may be present as a result of etching. Alternatively, an 11 treatment may be performed in a conventional pre-clean chamber, followed up by an e-beam treatment with Ar.

In accordance with a further embodiment of the present invention, a lower-k dielectric film is: (a) e-beam treated as a pre-clean processing step and/or as a sidewall-pore seal treatment process step; (b) an adhesion/barrier/Cu seed layer is deposited thereon; and (c) the adhesion/barrier/Cu seed layer is e-beam treated to ensure proper sidewall coverage and/or to affect dielectric constant and mechanical properties of the barrier layer.

E-Beam Treat Low-k Dielectric Films

In accordance with one or more embodiments of the present invention, a low-k dielectric film is e-beam treated to improve its copper diffusion barrier properties. This step is carried out in the manner described above in processes to produce e-beam treated films. For example, such an e-beam treatment would be applied to, amorphous hydrogenated silicon carbide films such as, for example, and without limitation, BLOk™, BLOk II, and to lower-k organo-silicon-based films deposited by CVD or spin-on processes.

It is believed that an e-beam treatment of amorphous, hydrogenated, silicon carbide films such as, for example, and without limitation, BLOk™ will remove hydrogen, and promote densification to generate more stoichiometric SiC films having increased hardness, etch selectivity, and resistance to copper diffusion. BLOK is formed in a chamber like that described above in conjunction with FIG. 2 utilizing a trimethylsilane precursor. However, such e-beam treatment of BLOk may also increase its dielectric constant, and potentially its intrinsic conductivity; thereby possibly resulting in leakage in barrier layers formed using such films. Nevertheless, it is expected that such e-beam treatments (by virtue of improving etch selectivity and diffusion barrier properties) will enable the use of thinner BLOk barrier layers (for example, reducing film thicknesses from a range of about 250 Å to about 400 Å to film thicknesses in a range of about 75 Å to about 150 Å). As a result, there will be an overall reduction in effective capacitance in structures formed using such thinner layers relative to the use of thicker layers.

BLOk II™ is an amorphous, hydrogenated, silicon carbide film produced using a cyclic precursor such as, for example, phenyldimethylsilane. BLOk II is formed in a chamber like that described above in conjunction with FIG. 2 utilizing a phenyldimethylsilane precursor. For example, in accordance with one embodiment of the present invention, a process recipe for forming BLOk™ II includes: a flow rate for phenyldimethylsilane of about 1000 mgm, a flow rate for a He diluent of about 2000 sccm, a chamber pressure of about 6 Torr, a temperature of a wafer or substrate holder of about 350° C., a wafer-to-showerhead spacing of about 450 mils, and an RF power of about 200 W. After this film was deposited, it was e-beam treated in a chamber like that described above in conjunction with FIG. 1. The process conditions were: a chamber pressure in an ambient gas of Ar of about 15 mTorr; a voltage of about 4.5 KeV; an electron current of about 3 ma; a wafer temperature of about 400° C.; and at various treatment doses of about 50, 100, and 200 $\mu C/cm^2$ for about 2 min. Advantageously, it was found that the treated film: (a) was densified; (b) was not leaky; and (c) was a good Cu diffusion barrier. It is believed that due to e-beam treatment, a silicon carbide phenyl network was formed, and that the phenyl constituent enabled the film to retain its insulating properties while still providing good resistance to Cu diffusion.

In accordance with one or more such embodiments of the present invention, in a first step of a method of producing a low-k dielectric film, an organo-silicon-based film may be CVD-deposited, for example, and without limitation, using the chamber described above in conjunction with FIG. 2 using an oxidizer (such as, for example, and without limitation, $H_2O_2$, $O_3$, and so forth) and an organo-silicon precursor (such as, for example, and without limitation, precursors containing aromatic (phenyl) rings (such as, for example, and without limitation, phenyldimethylsilane and diphenylsilane)). Next, in accordance with this embodiment of the present invention, in a second step of the method of producing a low-k dielectric film, an e-beam treatment (including heating the film at the same time) is carried out on the CVD-deposited film, for example, and without limitation, using the chamber described above in conjunction with FIG. 1. Finally, in accordance with this embodiment of the present invention, in an optional third step of the method of producing a low-k dielectric film, the e-beam treated film may be thermally annealed.

Diffusion Barrier SOD: In accordance with one or more embodiments of the present invention, in a first step of a method of producing a low-k dielectric film, a relatively "soft" polymeric lower-k dielectric film (including, for example, and without limitation, an organo-silicon-based film) is deposited by a spin-on process using precursor materials such as, for example, and without limitation, poly(phenylmethyl)silane, as well its various copolymers with poly(dimethyl)silane and poly(diphenyl)silane; poly (phenylmethyl)siloxanes, and other poly(organo)siloxanes and poly(organo)silsequioxanes. Next, in accordance with this embodiment of the present invention, in a second step of the method of producing low-k dielectric films, an e-beam treatment is carried out on the spin-on dielectric ("SOD") film to convert it into a hard, heavily cross-linked film. Finally, in accordance with this embodiment of the present invention, in an optional third step of the method of producing low-k dielectric films, the e-beam treated film is thermally annealed.

Utilize an E-Beam Treated Dielectric Film as a Cap Film

In accordance with one or more embodiments of the present invention, one or more of the above-described low-k dielectric, e-beam treated films may be used as a cap to provide, for example, and without limitation, a moisture barrier, for underlying films.

Utilize an E-Beam Treated Film in Etch Applications

A typical etch selectivity of current amorphous carbon layer films is about 6:1 for carbon/silicon and about 15:1 for carbon/oxide. For high aspect ratio ("HAR") etch processes (for example an HAR contact etch) and deep trench etch processes, higher etch selectivities are required. In accordance with one or more embodiments of the present invention, an e-beam treated, improved amorphous carbon layer film has a sufficiently high etch selectivity to enable critical, high selectivity etch processes.

In accordance with one or more such embodiments of the present invention, an e-beam treated, organo-silicon-based, barrier layer (and especially a carbon-rich such film) has a reduced dielectric constant, and an enhanced etch selectivity when compared with carbon-doped-oxide low k dielectric films. Incorporation of additional carbon, particularly in the form of aromatic moieties such as, for example, and without limitation, phenyl, which efficiently crosslink under e-beam exposure, permits the use of carbon-doped-oxide etch processes having high etch rate selectivity to the barrier layer when etching a via (and stopping on the barrier layer). Also, the use of e-beam treated, organo-silicon-based, barrier layers can enable use of barrier open processes in damascene processes that exhibit high etch selectivity to carbon-doped-oxide films, and that are less aggressive to underlying metallization, in particular, copper. For example, the use of an anisotropic (biased) hydrogen-plasma based strip process can be used to selectively open the barrier layer (relative to carbon-doped-oxide in the trench and/or via) with little or no damage to the underlying copper during an over etch process. The above is true as well, for example, and without limitation, for an e-beam treated, amorphous carbon layer film. The use of such improved films will solve a present problem that occurs with the use of a BLOk film as a barrier layer in damascene applications involving the use of a Black Diamond film as a low-k dielectric layer. The problem occurs because the BLOk film exhibits little or no etch rate selectivity with respect to the Black Diamond (about 1:1) during barrier open etch processes, which etch processes suffer from the further problem in that they are oxidizing with respect to an exposed copper surface.

Utilize an E-Beam Treatment in a Pre-Clean CuO Application

As is well known, applications in which processing takes place on Cu interconnect lines and vias must have a pre-clean process performed to remove CuO formed on the Cu. In accordance with one embodiment of the present invention, the CuO is e-beam treated to remove oxygen from the CuO.

Utilize an E-Beam Treated Film in BPSG Reflow Applications

A typical BPSG ("Boron-Phosphorus-Silicon-Glass") deposition recipe used to form a 5 wt % of Boron and 5 wt % of Phosphorus silicon oxide film on a wafer or substrate in a thermal chemical vapor deposition ("CVD") process is: a temperature of a wafer or substrate holder is about 480° C.; a flow rate for tetraethoxysilane ("TEOS") is about 600 sccm; a flow rate for triethylborate ("TEB") is about 200 sccm; a flow rate for triethylphosphate ("TEPO") is about 100 sccm; a deposition chamber pressure is about 200 Torr; a flow rate for $O_3$ is about 4000 sccm; and spacing between a showerhead gas inlet and the wafer or substrate is about 220 mil. This process can be carried out in a thermal CVD chamber known as a Sub-Atmospheric Chemical Vapor Deposition ("SACVD") deposition chamber available from Applied Materials, Inc. of Santa Clara, Calif. As is known, an important property of BPSG films is that they exhibit a viscosity change at elevated temperatures. This property is used in a process that is referred to in the art as a "reflow" process that enables as deposited voids to be filled. As was mentioned previously, there is a continuing trend in the semiconductor industry to reduce the thermal budget for processing in general, and for such BPSG deposition and reflow processes in particular. For example, one present BPSG deposition and reflow process entails using a 2-step BPSG deposition process followed by a steam annealing or reflow step to enable the thermal budget to be reduced to 700° C. (see U.S. Pat. No. 6,360,685 which is incorporated by reference herein).

In accordance with one embodiment of the present invention, an e-beam treatment after BPSG deposition will enable a further reduction in the reflow or anneal temperature (for example, it is believed that such temperatures may be as low as below about 500° C.), and/or shorten the reflow or annealing time.

In accordance with such another embodiment of the present invention, the reflow or anneal step is carried out during the e-beam treatment by heating the wafer during e-beam treatment.

Utilize an E-Beam Treated Film in SACVD Deposition Applications

As is well known, many deposition applications exist wherein silicon oxide films are deposited using an SACVD deposition process (carried out in the SACVD deposition chamber that available from Applied Materials, Inc. of Santa Clara, Calif.) over a silicon oxide film deposited using a plasma enhanced chemical vapor deposition ("PECVD") process (using, for example, a PECVD DxZ deposition chamber available from Applied Materials, Inc. of Santa Clara, Calif.). As is known, the SACVD deposited silicon oxide films exhibit sensitivity to the underlying PECVD silicon oxide films, for example, and without limitation, by exhibiting varying deposition rates. In accordance with one embodiment of the present invention, this sensitivity is reduced (or eliminated), at least as to one or more of the properties in which sensitivity is exhibited, by an e-beam treatment of the PECVD silicon oxide prior to depositing the SACVD silicon oxide.

Utilize an E-Beam Treated Amorphous Carbon-Based Film in E-Beam Lithography Applications In accordance with one embodiment of the present invention, an e-beam resist structure for use in e-beam lithography applications is fabricated by a process that includes depositing an amorphous carbon layer film, and e-beam treating the film to enhance its conductivity (e-beam treatment of an amorphous carbon layer film can cause the amorphous carbon layer film to become conductive). Next, an e-beam resist is deposited. Then, in use, when the inventive abeam resist structure is exposed to a lithographic e-beam to create a pattern for etching, the conductive amorphous carbon layer film will prevent charge up of the resist. After the pattern etching using the patterned resist structure, the amorphous carbon layer film can readily be removed by conventional strip processes such as, for example, and without limitation, a conventional $O_2$ ashing process.

Utilize an E-Beam Treated Amorphous Carbon-Based Film in Ion Implant Applications In accordance with one embodiment of the present invention, an implant structure for use during ion implant applications is fabricated by a process that includes depositing an amorphous carbon layer film, and e-beam treating the film to enhance its conductivity (e-beam treatment of an amorphous carbon layer film can cause the amorphous carbon layer film to become conductive). Next, an ion implant process would be carried out. Advantageously, the conductive amorphous carbon layer film would prevent charge up. After implanting, the amorphous carbon layer film can readily be removed by conventional strip processes such as, for example, and without limitation, using a conventional $O_2$ ashing process.

Utilize an E-Beam Treated Dielectric Films in CMP Applications

A problem exists in that a large number of low-k dielectric films are hydrophobic. This causes a problem for post-CMP cleaning process because water marks and other organic defects remain after the cleaning process. In accordance with one embodiment of the present invention, after a CMP process, the film is e-beam treated to change at least the surface wetting properties of the film (it is believed by promoting more Si—$CH_x$—Si bonding). For example, an e-beam treatment can make the surface hydrophilic, as shown from wetting angle measurements. Advantageously, this solves the problem associated with post-CMP cleaning. In accordance with further embodiments, the film is e-beam treated prior to CMP planarization, at least to a depth at which planarization will end. In accordance with this embodiment, the dielectric at the appropriate depth is made hydrophilic.

Processing Tools for E-Beam Treatment

In accordance with one or more embodiments of the present invention, e-beam treatment takes place on a cluster tool such as, for example, and without limitation, a Centura™ cluster tool mainframe or an Endura™ cluster tool mainframe that are available from Applied Materials, Inc. of Santa Clara Calif. In accordance with another embodiment of the present invention, film deposition and e-beam treatment take place on a cluster tool having, for example, one or more e-beam treatment chambers, one or more CVD deposition chambers, and a transfer chamber to transfer a wafer or substrate from one chamber to another while continuously maintaining vacuum conditions. In accordance with yet another embodiment of the present invention, thermal cure and e-beam treatment take place on a cluster tool having, for example, one or more thermal cure processing chambers for use, for example, and without limitation, for thermally curing spin-on dielectric films or low-k CVD films, one or more e-beam treatment chambers, and a transfer chamber to transfer a wafer or substrate from one chamber to another while continuously maintaining vacuum conditions.

In accordance with the above-described embodiments, wafers are continuously maintained in an isolated environment at one or more vacuum pressure levels, and are transferred into and out of an external factory environment through one or more access ports in a factory/cluster tool interface. In a typical such system, a cassette or carrier with a series of wafers is placed at an interface port of a factory interface of the cluster tool, and latches release the interface port door. A robot picks up the cassette or individual wafers and moves them into a loadlock. From there, a transfer robot in the transfer chamber moves a wafer from the cassette in the loadlock to various ones of the processing chamber connected to the transfer chamber. The transfer robot may move the wafer from various ones of the processing chamber, and then back to the cassette in the loadlock. After processing of all the wafers in the cassette is complete, the cassette is move back into the factory interface, and from there out of the tool. Such a wafer processing technique essentially eliminates contamination since processing takes place after the wafers are sealed in the internal vacuum environment, and they are not removed prior to completion of processing.

In accordance with alternatives to above-described embodiments of the present invention, one or more e-beam treatment chambers are affixed to a factory interface to the cluster tool. Lastly, in accordance with still yet another embodiment of the present invention, spin-on coating, thermal cure, abeam treatment, and CVD deposition take place on a cluster tool having, for example, one or more spin-on coating chambers, one or more thermal cure processing chambers for use, for example, and without limitation, for thermally curing spin-on dielectric films, one or more e-beam treatment chambers, one or more CVD deposition chambers, and one or more transfer chambers to transfer a wafer or substrate from one chamber to another while continuously maintaining vacuum conditions. In accordance with one such embodiment, a wafer cassette is presented to a factory interface. A robot in the factory interface transfers the cassette to a loadlock, and a transfer chamber robot moves wafers from the cassette to various spin-on coating chambers. The transfer robot then transfers the wafers to transfer stations, and a second transfer robot moves the wafers from the transfer stations to various cure and abeam treatment chambers, and optionally, CVD deposition chambers. Optionally, the second transfer robot then transfers the wafers to second transfer stations, and a third transfer robot moves the wafers from the second transfer stations to various CVD deposition chambers. Then, the transfer process is reversed so the wafers wind up in the cassettes in the factory.

Remote Plasma Clean of E-Beam Treatment Chamber

During e-beam treatment of low-k dielectric CVD deposited films, spin-on dielectric deposited films, photoresists, and abeam resists, and so forth, it is probable that various organic and/or organo-silicon-based species will be volatilized and outgassed from the e-beam treated films—at least some of which outgassed species will deposit on the walls of the e-beam treatment chamber. Such species include, for example, and without limitation: (a) from low-k dielectrics (SOD or CVD—organo-silicon-based films, both porous and non-porous): (Si—$CH_x$), (O—Si—$CH_x$), (O—Si—H), Si, C, and ($CH_x$); and (b) from photoresist or organic low-k films: ($CH_x$) and ($CH_x$)$_n$. In particular, these species can be adsorbed as a residue on chamber walls, on the e-beam source, and on other areas of the e-beam treatment chamber. Over time, failing to clean the residue from the e-beam treatment chamber may produce poor process performance, and may also produce high particle counts on wafers that are processed. A prior art method for cleaning an e-beam treatment chamber involves using clean-wipes to physically hand wipe the chamber. This is problematic because it is time consuming, and does not ensure that the chamber is completely clean.

In accordance with one embodiment of the present invention, a method for cleaning an e-beam treatment chamber entails the use of a remote plasma source (although use of an in-situ plasma source is also possible) to form a plasma of a cleaning gas. The use of a remote plasma source is advantageous because, among other things, it requires fewer changes to the abeam treatment chamber design shown in FIG. 1, which changes might be required to facilitate striking a capacitively or inductively coupled plasma for an in-situ plasma source. However, it should be clean to those of ordinary skill in the art how to make appropriate changes to effectuate an in-situ plasma source.

In accordance with one embodiment of the present invention that utilizes a remote plasma source, an RF plasma source or a microwave plasma source would generate free radicals that would be directed to flow into the treatment chamber to interact with residues therewithin to create volatile by-products that would be pumped from the chamber. The remote plasma source may be a microwave generated remote plasma source which is well known to those of ordinary skill in the art, or it may be an RF inductively-coupled remote plasma source which is well known to those of ordinary skill in the art. The particular conditions of microwave or inductive RF power and pressure may be determined routinely by one or ordinary skill in the art without undue experimentation. In addition, the power and pressure used for various sized chambers may also be determined routinely by one or ordinary skill in the art without undue experimentation. In further addition, the frequency of cleaning process would depend on the extent of residue generated during the e-beam treatment process.

In accordance with one or more embodiments of the present invention, a cleaning gas includes one or more of: $NF_3$, $F_2$, $CF_4$, $C_2F_6$, $C_3F_8$, $SF_6$, and combinations of one or more of these cleaning gases, along with optional additives or carrier gases such as, for example, and without limitation, He, Ar, N, and $O_2$, and combinations of one or more of these additives. In accordance with such embodiments, diluent gasses such as, for example, and without limitation, helium can also be added to the clean gas. It is believed that radicals formed from a plasma of these cleaning gases will react with silicon-containing residues in the chamber to form, for example, $SiF_4$, which is volatile and can be pumped out of the chamber. Different gases may be utilized to remove organic residue generated during e-beam treatment of photoresist materials or organic dielectrics (for example, e-beam treatment of low-k CVD films or SOD formulations containing removable pendant groups or containing organic porogens or surfactants designed to decompose and generate porosity). In accordance with one or more embodiments of the present invention, a cleaning gas for such applications may include one or more of $O_2$, $N_2$, $H_2$, $H_2O$ vapor, and combinations of one or more of these cleaning gases, along with optional additives or carrier gases such as, for example, and without limitation, He, and Ar, and combinations of one or more of these additives.

In accordance with one or more embodiments of the present invention for cleaning a treatment chamber contaminated with organo-silicon-based residue, a cleaning process may involve forming an $NF_3$ plasma in a microwave remote plasma source at a pressure in a range from about 0.5 Torr to about 10 Torr, and at a microwave source power in a range from about 0.5 KW to about 2.5 KW. If the source is an RF inductively-coupled power source such as for example, an inductively coupled coil operating at about 13.56 MHz, the pressure and power operating regimes may have to be adjusted, for example, by using higher power levels.

In accordance with one embodiment of the present invention, radicals formed in the remote plasma chamber may be directed to enter the chamber through gas inlet tubes directed to flow gas into an area above the wafer. However, in accordance with other embodiments, the radicals may be directed to enter the chamber through gas inlet tubes directed to flow gas into other areas in which residue may build up, or into other areas in combination with the area above the wafer.

In accordance with one embodiment of the present invention, a portable remote plasma cleaning module (with everything including source gas transported as a unit on a cart for example) would be used to generate radicals which are directed into the e-beam treatment chamber to clean residues. In accordance with such a blank-off flange port would be added to the e-beam treatment chamber so that the radicals produced by the remote plasma cleaning module will enter the e-beam treatment chamber to be cleaned on a "line of sight" path.

In accordance with a further embodiment of the present invention, the a beam treatment chamber is cleaned in a process wherein the e-beam source is used to energize a cleaning gas that flows into the chamber. For example, a fluorine-containing cleaning gas may be utilized to clean the chamber after treating carbon-doped oxide type films, and oxygen and/or hydrogen may be utilized to clean the chamber after treating organic type films. The cleaning rates may be determined routinely by one or ordinary skill in the art without undue experimentation.

Those skilled in the art will recognize that the foregoing description has been presented for the sake of illustration and description only. As such, it is not intended to be exhaustive or to limit the invention to the precise form disclosed. For example, although certain dimensions were discussed above, they are merely illustrative since various designs may be fabricated using the embodiments described above, and the actual dimensions for such designs will be determined in accordance with circuit requirements. In addition, the term substrates include those suitable to be processed into an integrated circuit or other microelectronic device, and is used in the broadest sense of the word. Suitable substrates for the present invention non-exclusively include semiconductor materials such as gallium arsenide (GaAs), germanium, silicon, silicon germanium, lithium niobate and compositions containing silicon such as crystalline silicon, polysilicon, amorphous silicon, epitaxial silicon, and silicon oxide and combinations mixtures thereof. The term substrates also include glass substrates of any kind.

What is claimed is:

1. A method for fabricating a low-k dielectric film, comprising:
   chemical vapor depositing a low-k dielectric film; and
   e-beam treating the low-k dielectric film;
   wherein the low-k dielectric film contains silicon, oxygen, and carbon; and
   wherein the chemical vapor depositing utilizes a precursor comprising one or more cyclic organo-silicon compounds and one or more hydrocarbon compounds.

2. The method of claim 1 wherein the e-beam treating includes heating the low-k dielectric film.

3. The method of claim 1 further comprising thermally annealing the e-beam treated film.

4. The method of claim 1 wherein the precursor further comprises one or more acyclic organo-silicon compounds.

5. The method of claim 4 wherein the precursor further comprises one or more oxidizers.

6. The method of claim 5 wherein one or more of the one or more cyclic organo-silicon compounds includes at least one silicon-carbon bond; one or more of the one or more acyclic organo-silicon compounds includes a silicon-hydrogen bond or a silicon-oxygen bond; and the one or more hydrocarbon compounds is linear or cyclic.

7. The method of claim 6 wherein one or more of the one or more hydrocarbon compounds includes a carbon—carbon double or triple bond.

8. The method of claim 4 wherein at least one of the one or more cyclic or acyclic organo-silicon compounds contains oxygen.

9. The method of claim 5 wherein the low-k film contains a network —Si—O—Si— ring structures that are cross-linked with one or more linear organic compounds.

10. The method of claim 9 wherein the low-k film further contains between about 10 arid about 30 atomic percent of carbon, excluding hydrogen atoms.

11. The method of claim 1 wherein one or more of the one or more cyclic organo-silicon compounds includes a ring structure having three or more silicon atoms.

12. The method of claim 11 wherein the ring structure further comprises one or more oxygen atoms.

13. The method of claim 12 wherein one or more of the one or more cyclic organo-silicon compounds includes one or more of: 1,3,5-trisilano-2,4,6-trimethylene, 1,3,5,7-tetramethylcyclotetrasiloxane; octamethylcyclotetrasiloxane; 1,3,5,7,9-pentamethylcyclopentasiloxane; 1,3,5,7-tetrasilano-2,6-dioxy-4,8-dimethylene; and hexamethylcyclotrisiloxane.

14. The method of claim 4 wherein one or more of the one or more acyclic organo-silicon compounds includes one or more of: linear or branched acyolic organo-silicon compounds having one or more silicon atoms and one or more carbon atoms.

15. The method of claim 14 wherein one or more of the one or more acyclic organo-silicon compounds further includes oxygen.

16. The method of claim 14 wherein one or more of the one or more acyclic organo-salicon compounds includes one or more of: methylsilane; dimethylsilane; trimethylsilane; tetramethylsilane; ethylsilane; disifanomethane; bis(methylsilano)methane; 1,2-disilanoethane; 1,2-bis(methylsilano)ethane; 2,2-disilanopropane; 1,3-dimethyldisiloxane: 1,1,3,3-tetramethyldisiloxane; hexamethyldisiloxane; 1,3-bis(silanomethylene)disiloxane; bis(1-methyldisiloxanyl)methane; 2,2-bis(1-methyldisiloxanyl)propane; hexamethoxydisiloxane; diethylsilane; propylsilane; vinylmethylsilane; 1,1,2,2-tetramethyldisilane; hexamethyldisilane; 1,1,2,2,3,3-hexamethyltrisilane; 1,1,2,3,3-pentamethyltrisilane; dimethyldisilanoethane; dimethyldisilanopropane; tetramethyldisilanoethane; and tetramethyldisilanopropane.

17. The method of claim 1 wherein the one or more hydrocarbon compounds comprises a linear or branched hydrocarbon compound including between one and about 20 adjacent carbon atoms.

18. The method of claim 17 wherein the adjacent carbon atoms are bonded by any combination of single, double, and triple bonds.

19. The method of claim 18 wherein the linear or branched hydrocarbon compound includes an alkene having two to about 20 carbon atoms.

20. The method of claim 1 wherein the one or more hydrocarbon compounds includes one or more of: ethylene; propylene; acetylene; butadiene; t-butylethylene; and 1,1,3,3-tetramethylbutylbenzene.

21. The method of claim 5 wherein one or more of the one or more oxidizers includes one or more of: oxygen; ozone; nitrous oxide; carbon monoxide; carbon dioxide; water; hydrogen peroxide; and an oxygen-containing organic compound.

22. The method of claim 5 wherein the precursor comprises about 5 percent by volume to about 80 percent by volume of the one or more cyclic organo silicon compounds, about 5 percent by volume to about 15 percent by volume of the one or more acyclic organo-silicon compounds, about 5 percent by volume to about 45 percent by volume of the one or more hydrocarbon compounds, and about 5 percent by volume to about 20 percent by volume of the one or more oxidizers.

23. A method of depositing a low dielectric constant film, comprising:

reacting a mixture comprising one or more organo-silicon compounds and a cyclic hydrocarbon compound at conditions sufficient to deposit a low dielectric constant film comprising silicon, oxygen, and carbon; and e-beam treating the low dielectric constant film.

24. The method of claim 23, wherein the one or more organo-silicon compounds comprises one or more acyclic organo-silicon compounds.

25. The method of claim 24, wherein one or more of the one or more acyclic organo-silicon compounds comprises oxygen.

26. The method of claim 24, wherein the one or more acyclic organo-silicon compounds are selected from the group consisting of methylsilane, dimethylsilane, trimethylsilane, tetramethylsilane, ethylsilane, disilanomethane, bis(methylsilano)methane, 1,2-disilanoethane, 1,2-bis(methylsilano)ethane, 2,2-disilanopropane, 1,3-dimethyldisiloxane, 1,1,3,3-tetramethyldisiloxane, hexamethyldisiloxane, 1,3-bis(silanomethylene)disiloxane, bis(1-methyldisiloxanyl)methane, 2,2-bis(1-methyldisiloxanyl)propane, hexamethoxydisiloxane; diethylsilane; propylsilane; vinylmethylsilane, 1,1,2,2-tetramethyldisilane, hexamethyldisilane, 1,1,2,2,3,3-hexamethyltrisilane, 1,1,2,3,3-pentamethyltrisilane, dimethyldisilanoethane, dimethyldisilanopropane, tetramethyldisilanoethane, and tetramethyldisilanopropane.

27. The method of claim 23, wherein the cyclic hydrocarbon compound comprises one or two carbon—carbon double bonds.

28. The method of claim 27, wherein the cyclic hydrocarbon compound is vinylcyclohexane or norbornadiene.

29. The method of claim 23, wherein the mixture further comprises one or more oxidizing gases.

30. A method of depositing a low dielectric constant film, comprising:

reacting a mixture comprising one or more organo-silicon compounds and a hydrocarbon compound at conditions sufficient to deposit a low dielectric constant film comprising silicon, oxygen, and carbon; and e-beam treating the low dielectric constant film.

31. The method of claim 30, wherein the one or more organo-silicon compounds comprises one or more acyclic organo-silicon compounds.

32. The method of claim 31, wherein one or more of the one or more acyclic organo-silicon compounds comprises oxygen.

33. The method of claim 31, wherein the one or more acyclic organo-silicon compounds are selected from the group consisting of methylsilane, dimethylsilane, trimethylsliane, tetramethylsilane, ethylsilane, disilanomethane, bis(methylsilano)methane, 1,2-disilanoethane, 1,2-bis(methylsilano)ethane, 2,2-disilanopropane, 1,3-dimethyldisiloxane, 1,1,3,3-tetramethyldisiloxane, hexamethyldisiloxane, 1,3-bis(silanomethylene)disiloxane, bis(1-methyldisiloxanyl)methane, 2,2-bis(1-methyldisiloxanyl)propane, hexamethoxydisiloxane; diethylsilane; propylsilane; vinylmethylsilane, 1,1,2,2-tetramethyldisilane, hexamethyldisilane, 1,1,2,2,3,3-hexamethyltrisilane, 1,1,2,3,3-pentamethyltrisilane, dimethyldisilanoethane, dimethyldisilanopropane, tetramethyldisilanoethane, and tetramethyldisilanopropane.

34. The method of claim 30, wherein the hydrocarbon compound is a linear or branched hydrocarbon compound.

35. The method of claim 34, wherein the hydrocarbon compound is selected from the group consisting of ethylene, propylene, acetylene, butadiene, and t-butylethylene.

36. The method of claim 30, wherein the mixture further comprises one or more oxidizing gases.

\* \* \* \* \*

UNITED STATES PATENT AND TRADEMARK OFFICE
CERTIFICATE OF CORRECTION

PATENT NO. : 6,936,551 B2  Page 1 of 2
APPLICATION NO. : 10/428374
DATED : August 30, 2005
INVENTOR(S) : Farhad Moghadam et al.

It is certified that error appears in the above-identified patent and that said Letters Patent is hereby corrected as shown below:

Column 3, Lines 32 and 44, and Column 7, Line 23: Change "abeam" to --e-beam--

Column 8, Line 49: Change "look" to --low-k--

Column 18, Line 57, and Column 19, Line 7: Change "abeam" to --e-beam--

Column 19, Lines 39 and 60: Change "seem" to --sccm--

Column 30, Line 21, and Column 32, Line 9: Change "abeam" to --e-beam--

Column 32, Line 64: Change "($CH_6$)" to --($C_3H_6$)--

Column 33, Line 53, and Column 34, Line 6: Change "as deposited" to --as-deposited--

Column 35, Lines 48 and 50: Change "abeam" to --e-beam--

Column 36, Line 31: Change "H2" to --$H_2$--

Column 36, Line 34: Change "11" to --$H_2$--

Column 39, Line 13: Change "as deposited" to --as-deposited--

Column 39, Line 60, and Column 41, Lines 15, 30, 41, and 67: Change "abeam" to --e-beam--

Column 42, Line 30: Change "N" to --$N_2$--

Column 43, Line 14: Change "abeam" to --e-beam--

UNITED STATES PATENT AND TRADEMARK OFFICE
CERTIFICATE OF CORRECTION

PATENT NO. : 6,936,551 B2
APPLICATION NO. : 10/438374
DATED : August 30, 2005
INVENTOR(S) : Farhad Moghadam et al.

It is certified that error appears in the above-identified patent and that said Letters Patent is hereby corrected as shown below:

Column 44, Line 5: Insert --of-- after "network"

Column 44, Line 8: Change "arid" to --and--

Column 44, Line 24: Change "acyolic" to --acyclic--

Column 44, Line 33: Change "disifanomethane" to --disilanomethane--

Signed and Sealed this

First Day of August, 2006

JON W. DUDAS
*Director of the United States Patent and Trademark Office*